United States Patent
Oh et al.

(10) Patent No.: US 10,290,772 B2
(45) Date of Patent: May 14, 2019

(54) LIGHT-EMITTING DIODE AND MANUFACTURING METHOD THEREFOR

(71) Applicant: SEOUL VIOSYS CO., LTD., Ansan-si (KR)

(72) Inventors: Se Hee Oh, Ansan-si (KR); Jong Kyu Kim, Ansan-si (KR); Jae Kwon Kim, Ansan-si (KR); Min Woo Kang, Ansan-si (KR); Hyun A Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/925,533

(22) Filed: Mar. 19, 2018

(65) Prior Publication Data
US 2018/0212109 A1 Jul. 26, 2018

Related U.S. Application Data

(63) Continuation of application No. 15/501,815, filed as application No. PCT/KR2015/008150 on Aug. 4, 2015, now Pat. No. 9,923,121.

(30) Foreign Application Priority Data

Aug. 5, 2014 (KR) .................. 10-2014-0100364
Aug. 4, 2015 (KR) .................. 10-2015-0109959

(51) Int. Cl.
*H01L 33/38* (2010.01)
*F21K 9/238* (2016.01)
(Continued)

(52) U.S. Cl.
CPC ............ *H01L 33/387* (2013.01); *F21K 9/232* (2016.08); *F21K 9/238* (2016.08); *F21S 41/141* (2018.01);
(Continued)

(58) Field of Classification Search
CPC ......... H01L 21/02365; H01L 21/02436; H01L 21/02518; H01L 21/70; H01L 21/702; H01L 21/71
See application file for complete search history.

(56) References Cited

U.S. PATENT DOCUMENTS

| 8,823,031 B2 | 9/2014 | Kususe |
| 9,899,578 B2 | 2/2018 | Sun et al. |

(Continued)

FOREIGN PATENT DOCUMENTS

| CN | 101595552 A | 12/2009 |
| JP | 2010027919 A | 2/2010 |

(Continued)

OTHER PUBLICATIONS

International Search Report in International Application No. PCT/KR2015/008150, dated Nov. 19, 2015.

(Continued)

*Primary Examiner* — Cheung Lee
(74) *Attorney, Agent, or Firm* — Perkins Coie LLP

(57) ABSTRACT

A light-emitting diode and a manufacturing method therefor are disclosed. The light-emitting diode comprises: a first conductive semiconductor layer; at least two light-emitting units arranged by being spaced from each other on the first conductive semiconductor layer, respectively including an active layer and a second conductive semiconductor layer, and including one or more contact holes through which the first conductive semiconductor layer is partially exposed; an additional contact area located between the light-emitting units; a second electrode making ohmic contact with the second conductive semiconductor layer; a lower insulation layer; and a first electrode making ohmic contact with the (Continued)

first conductive semiconductor layer through the contact holes of each of the light-emitting units and the additional contact area.

15 Claims, 22 Drawing Sheets

(51) Int. Cl.
| | |
|---|---|
| F21K 9/232 | (2016.01) |
| F21S 45/43 | (2018.01) |
| F21S 41/141 | (2018.01) |
| F21S 45/47 | (2018.01) |
| F21S 41/20 | (2018.01) |
| F21V 19/00 | (2006.01) |
| F21V 8/00 | (2006.01) |
| H01L 27/15 | (2006.01) |
| H01L 33/00 | (2010.01) |
| H01L 33/06 | (2010.01) |
| H01L 33/08 | (2010.01) |
| H01L 33/32 | (2010.01) |
| H01L 33/46 | (2010.01) |
| H01L 33/62 | (2010.01) |
| H01L 33/64 | (2010.01) |
| G02B 6/00 | (2006.01) |
| F21Y 115/10 | (2016.01) |
| F21S 41/143 | (2018.01) |
| F21S 41/255 | (2018.01) |

(52) U.S. Cl.
CPC ............. *F21S 41/285* (2018.01); *F21S 45/43* (2018.01); *F21S 45/47* (2018.01); *F21V 19/003* (2013.01); *G02B 6/00* (2013.01); *G02B 6/0055* (2013.01); *H01L 27/156* (2013.01); *H01L 33/007* (2013.01); *H01L 33/06* (2013.01); *H01L 33/08* (2013.01); *H01L 33/32* (2013.01); *H01L 33/382* (2013.01); *H01L 33/385* (2013.01); *H01L 33/46* (2013.01); *H01L 33/62* (2013.01); *H01L 33/641* (2013.01); *H01L 33/647* (2013.01); *F21S 41/143* (2018.01); *F21S 41/255* (2018.01); *F21Y 2115/10* (2016.08); *H01L 33/38* (2013.01); *H01L 2933/0016* (2013.01); *H01L 2933/0025* (2013.01); *H01L 2933/0066* (2013.01); *H01L 2933/0075* (2013.01)

(56) References Cited

U.S. PATENT DOCUMENTS

2010/0308367 A1   12/2010  Aldaz et al.
2013/0056758 A1    3/2013  Ziltener et al.

FOREIGN PATENT DOCUMENTS

JP         2010118624 A     5/2010
KR    1020090060367 A     6/2009

OTHER PUBLICATIONS

First Office Action in Chinese Patent Application No. 201580042254. 2, dated Jul. 2, 2018.

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

LIGHT-EMITTING DIODE AND MANUFACTURING METHOD THEREFOR

CROSS-REFERENCE TO RELATED APPLICATION(S)

The present application is a continuation of U.S. patent application Ser. No. 15/501,815, filed on Feb. 3, 2017, which is a 35 U.S.C. § 371 National Stage application of PCT Patent Application No. PCT/KR2015/008150, filed on Aug. 4, 2015, which claims the benefits and priorities of Korean Patent Application No. 10-2014-0100364, filed on Aug. 5, 2014 and Korean Patent Application No. 10-2015-0109959, filed on Aug. 4, 2015.

TECHNICAL FIELD

Exemplary embodiments of the present disclosure relate to a light emitting diode and a method of manufacturing the same, and more particularly, to a light emitting diode, which can minimize reduction in luminous area and has high current spreading efficiency, and a method of manufacturing the same.

BACKGROUND

A light emitting diode refers to an inorganic semiconductor device configured to emit light through recombination of electrons and holes, and in recent years, light emitting diodes using nitride semiconductors having direct transition characteristics have been developed and manufactured in the art.

Light emitting diodes can be classified into a lateral type light emitting diode and a flip-chip type light emitting diode depending upon locations of electrodes, a connection structure of the electrodes to external leads, and the like. Recently, with increasing demand for a high power light emitting diode, there is increasing demand for a large flip-chip type light emitting diode having good heat dissipation efficiency.

SUMMARY

Exemplary embodiments of the present disclosure provide a light emitting diode having improved current spreading efficiency.

Exemplary embodiments of the present disclosure provide a method of manufacturing a light emitting diode, which can minimize removal of an active layer while improving current spreading efficiency, and can provide a simple process.

In accordance with one aspect of the present disclosure, a light emitting diode includes: a first conductive type semiconductor layer; at least two light emitting units disposed on the first conductive type semiconductor layer to be spaced apart from each other and each including an active layer, a second conductive type semiconductor layer, and at least one contact hole formed through the second conductive type semiconductor layer and the active layer so as to expose a portion of the first conductive type semiconductor layer; an additional contact region disposed between the light emitting units and partially exposing the first conductive type semiconductor layer; a first electrode forming ohmic contact with the first conductive type semiconductor layer through the contact hole and the additional contact region of each of the light emitting units; a second electrode disposed on each of the light emitting units and forming ohmic contact with the second conductive type semiconductor layer; and a lower insulation layer covering a side surface of the first conductive type semiconductor layer, the light emitting units, and the second electrodes, wherein the lower insulation layer includes a first opening exposing the contact hole and the additional contact region and a second opening partially exposing the second electrode, and the first and second electrode are insulated from each other.

The first electrode may also form ohmic contact with the first conductive type semiconductor layer through the additional contact region, thereby improving current spreading efficiency of the light emitting diode.

The additional contact region may be disposed in a region between at least four light emitting units, specifically in a region in which one corner of each of the at least four light emitting units meets corners of other three light emitting units.

Distances from a center of the additional contact region to centers of the at least four light emitting units may be the same.

The contact hole may be disposed in a central region of each of the light emitting units.

The light emitting diode may further include one or more connection layers electrically connecting the second electrode disposed on one of the light emitting units to the second electrode disposed on another light emitting unit adjacent to the one light emitting unit.

The first electrode may cover at least part of the lower insulation layer and may contact the first conductive type semiconductor layer through the first opening.

The first electrode may further cover the first conductive type semiconductor layer and side surfaces of the light emitting units and may be insulated by the lower insulation layer.

In other exemplary embodiments, the light emitting diode may further include an upper insulation layer at least partially covering the first electrode, wherein the upper insulation layer may include a third opening partially exposing the first electrode and a fourth opening partially exposing the second electrode.

The light emitting diode may further include a first pad disposed on the third opening and electrically connected to the first electrode; and a second pad disposed on the fourth opening and electrically connected to the second electrode.

The light emitting diode may further include a heat dissipation pad disposed on the upper insulation layer.

The heat dissipation pad may be disposed between the first pad and the second pad.

In accordance with another aspect of the present disclosure, a method of manufacturing a light emitting diode includes: forming a first conductive type semiconductor layer, an active layer and a second conductive type semiconductor layer on a substrate; forming at least two light emitting units each including the second conductive type semiconductor layer, the active layer and contact holes, and an additional contact region disposed in a region between the light emitting units by partially removing the second conductive type semiconductor layer and the active layer, while forming a second electrode on each of the light emitting units so as to form ohmic contact with the second conductive type semiconductor layer; forming a lower insulation layer covering a side surface of the first conductive type semiconductor layer, the light emitting units, and the second electrodes; and forming a first electrode forming ohmic contact with the first conductive type semiconductor layer through the contact holes and the additional contact region, wherein the contact holes are formed through the second conductive type semiconductor layer and the active layer so as to expose a portion of the first conductive type semiconductor layer, the first conductive type semiconductor layer is exposed to a lower side of the additional contact region, and the lower insulation layer includes first openings exposing the contact holes and the additional contact region, and second openings partially exposing the second electrodes.

The light emitting units may include at least four light emitting units and the additional contact region may be disposed in a region surrounded by the at least four light emitting units.

The additional contact region may be disposed in a region in which one corner of each of the at least four light emitting units meets corners of other three light emitting units.

The method may further include forming one or more connection layers electrically connecting the second electrode disposed on one of the light emitting units to the second electrode disposed on another light emitting unit adjacent to the one light emitting unit.

The connection layers may be formed simultaneously with the first electrode.

Forming the first electrode may include filling the first openings with the first electrode such that the first electrode contacts the first conductive type semiconductor layer through the first openings.

The method may further include forming an upper insulation layer at least partially covering the first electrode after formation of the first electrode, wherein the upper insulation layer may include a third opening partially exposing the first electrode and a fourth opening partially exposing the second electrode.

The method may further include forming a first pad on the third opening so as to be electrically connected to the first electrode and a second pad on the fourth opening so as to be electrically connected to the second electrode.

The method may further include forming a heat dissipation pad on the upper insulation layer.

The first pad, the second pad and the heat dissipation pad may be formed at the same time.

In accordance with a further aspect of the present disclosure, a light emitting diode includes: a light emitting structure including a first conductive type semiconductor layer, an active layer, and a second conductive type semiconductor layer, the light emitting structure including one or more mesas disposed on the first conductive type semiconductor layer to be spaced apart from each other and each including the active layer and the second conductive type semiconductor layer and having at least one contact hole formed through the second conductive type semiconductor layer and the active layer so as to expose a portion of the first conductive type semiconductor layer; a first electrode forming ohmic contact with the first conductive type semiconductor layer through the contact holes of the mesas; a current spreading layer disposed on the mesas and forming ohmic contact with the second conductive type semiconductor layer; a second electrode disposed on the current spreading layer; and an insulation layer covering the light emitting structure and the current spreading layer, and including openings partially exposing the first and second electrodes, wherein each of the contact holes includes a plurality of main contact holes spaced apart from each other and a plurality of secondary contact holes connecting the main contact holes to each other and having a narrower width than the main contact holes.

The light emitting diode may further include a current blocking layer disposed under the current spreading layer, wherein the current blocking layer may be disposed below the second electrode so as to correspond to a location of the second electrode.

The current spreading layer may include a conductive oxide.

The current spreading layer may include a lower current spreading layer and an upper current spreading layer disposed on the lower current spreading layer.

The current spreading layer may be formed of a conductive oxide doped with a metallic dopant.

The light emitting diode may further include a first pad and a second pad disposed on the insulation layer and electrically connected to the first electrode and the second electrode, respectively, wherein the first and second pad are spaced apart from each other.

The first electrode may include a first ohmic contact electrode disposed under the first pad; a second ohmic contact electrode including a main electrode disposed under the first pad and an extension electrode extending from the main electrode to a portion under a region between the first pad and the second pad; and a third ohmic contact electrode disposed under the first pad and forming ohmic contact with the additional contact region.

The main electrode of the second ohmic contact electrode may be disposed in the main contact holes and the extension electrode of the second ohmic contact electrode may be disposed in the main contact holes and the secondary contact holes.

A portion of the extension electrode disposed in the main contact holes may have a greater width than a portion of the extension electrode disposed in the secondary contact holes and may be disposed under the region between the first pad and the second pad.

The extension electrode of the second ohmic contact electrode may be covered by the insulation layer.

The second electrode may include a first connection electrode disposed under the second pad; and a second connection electrode including a main electrode disposed under the second pad and an extension electrode extending from the main electrode towards the first pad.

The extension electrode of the second connection electrode may extend to a portion under a region between the first pad and the second pad.

The extension electrode of the second connection electrode may extend to a region under the first pad.

The extension electrode may have a smaller width than the main electrode.

The extension electrode may be covered by the insulation layer.

The mesa may be composed of a plurality of mesas; the light emitting structure may be disposed between the mesas and further include an additional contact region partially exposing the first conductive type semiconductor layer; and the first electrode disposed on the additional contact region may be exposed through the openings of the insulation layer.

The insulation layer may include a lower insulation layer and an upper insulation layer disposed on the lower insulation layer.

The lower insulation layer may have a greater thickness than the upper insulation layer, and the upper insulation layer may include a distributed Bragg reflector.

The lower insulation layer may be formed of $SiO_2$ and have a thickness of 0.2 µm to 1.0 µm, and the upper insulation layer may have a stack structure in which $TiO_2$/$SiO_2$ layers are alternately stacked one above another.

At least part of the first electrode and the second electrode may further cover an upper surface of the lower insulation layer around the openings of the lower insulation layer to be interposed between the lower insulation layer and the upper insulation layer.

According to exemplary embodiments, a light emitting diode has an additional contact region formed in a region surrounded by light emitting units, thereby improving current spreading efficiency and luminous uniformity. As a result, the light emitting diode has improved luminous efficacy and reliability.

In addition, the additional contact region is formed in a process of forming the light emitting units, thereby providing a light emitting diode having improved current spreading efficiency without separately performing an additional process.

Further, the light emitting diode includes electrodes including extension portions extending to a region between a first pad and a second pad, thereby improving current spreading efficiency.

Furthermore, the light emitting diode includes a multi-layer structure of current spreading layers, thereby improving current spreading efficiency and luminous efficacy.

DETAILED DESCRIPTION

Figure 1:
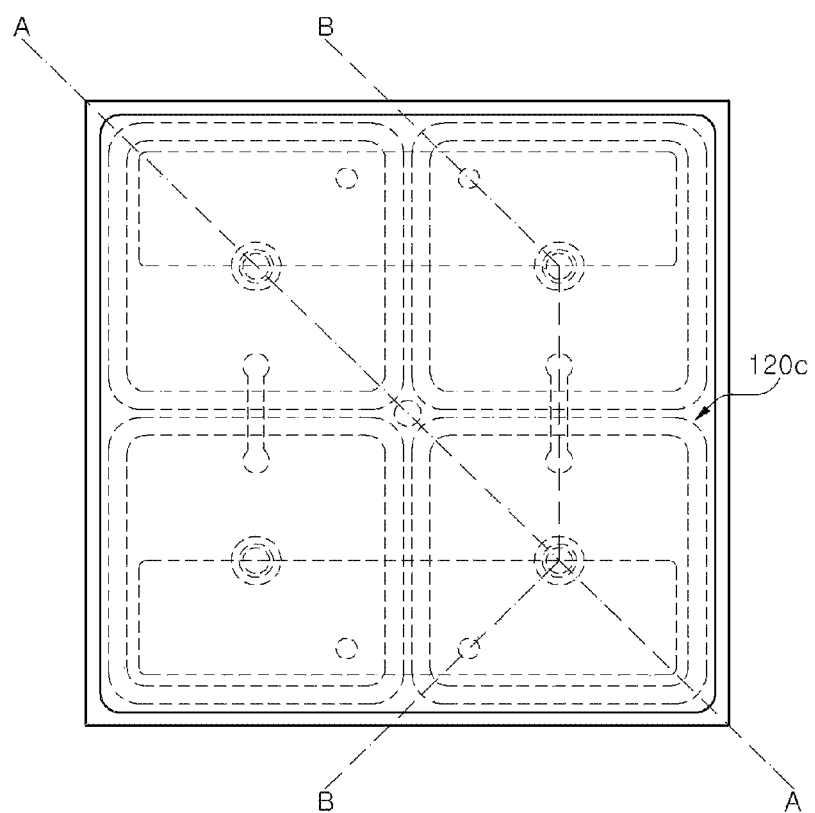
FIG. 1 to FIG. 3 are a plan view and cross-sectional views of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Recently, for an N-type electrode, structures in which an N-type electrode pad includes linear extension portions are proposed. Such linear extension portions are formed along a region of an N-type semiconductor layer exposed by removing the active layer through etching, whereby a luminous area of the light emitting diode is deceased by a removed portion of the active layer. Moreover, when the extension portions exhibit high resistance, the extension portions have a limitation in current spreading. Moreover, since a reflective electrode is restrictively disposed on a P-type semiconductor layer, substantial light loss occurs due to the pads and the extension portions instead of light reflection by the reflective electrode. Further, current crowding occurs depending upon locations of the N-type electrode and a P-type electrode, thereby forming a region exhibiting very low luminous efficacy. Moreover, a region for exposing the N-type semiconductor layer occupies a relatively large area in order to form the N-type electrode. This structure causes reduction in luminous area, thereby deteriorating overall luminous efficacy and luminous intensity of the light emitting diode.

In addition to such implementations, light emitting diodes having various electrode structures are disclosed in the art. However, according to such implementations, upon operation of the light emitting diode through application of electric current, current crowding occurs around the N-type electrode, thereby causing concentration of light emission around the N-type electrode.

Therefore, there is a need for a light emitting diode having an electrode structure and a semiconductor layer structure that secure good current spreading efficiency and a uniform luminous pattern of the light emitting diode.

Figure 2:
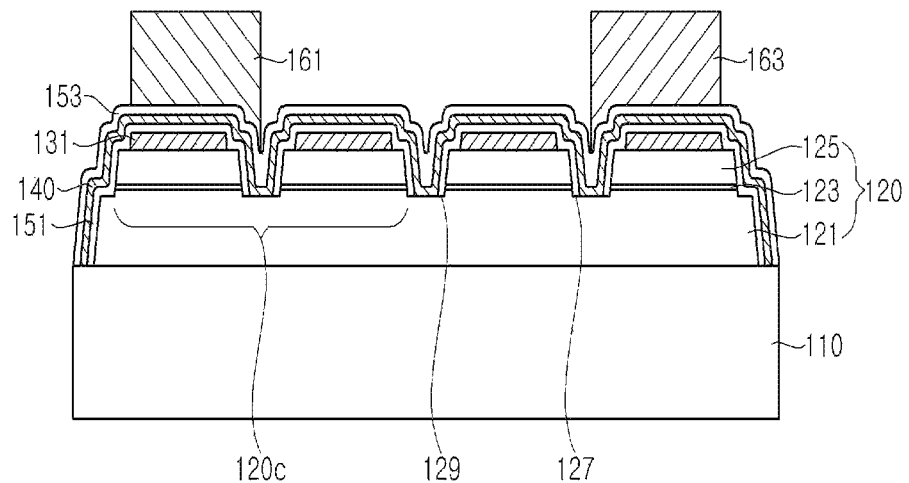
Figure 3:
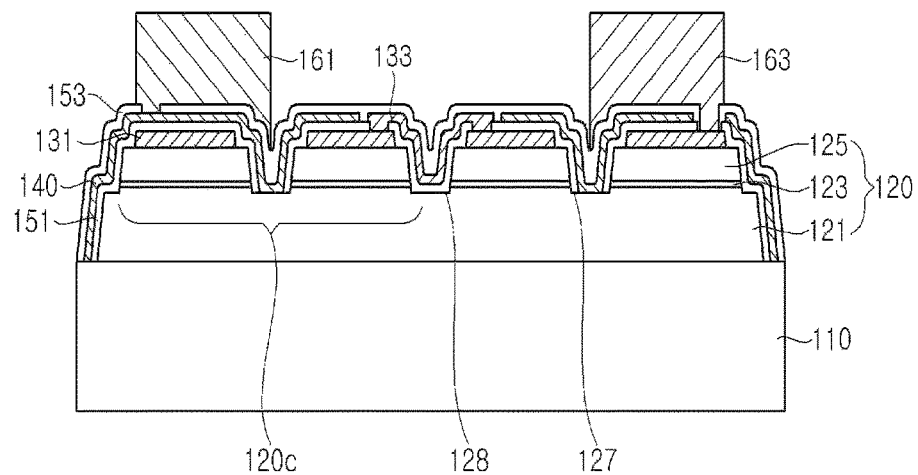

FIG. 1 to FIG. 3 are a plan view and cross-sectional views of a light emitting diode according to one exemplary embodiment of the present disclosure. FIG. 2 is a cross-sectional view taken along line A-A of FIG. 1 and FIG. 3 is a cross-sectional view taken along line B-B of FIG. 1. For convenience of description, some reference numerals are omitted in FIG. 1. Components denoted by reference numerals relating to the plan view will be described in more detail in exemplary embodiments described with reference to FIG. 5A to FIG. 11B.

Referring to FIG. 1 to FIG. 3, a light emitting diode according to one exemplary embodiment of the present disclosure includes a light emitting structure 120, which includes a first conductive type semiconductor layer 121, an active layer 123 and a second conductive type semiconductor layer 125, light emitting units 120c, a first electrode 140, and second electrodes 131. The light emitting diode may further include a substrate 110, a lower insulation layer 151, an upper insulation layer 153, a connection layer 133, a first pad 161, and a second pad 163.

The substrate 110 may be any substrate that allows growth of the light emitting structure 120 thereon, and may include, for example, a sapphire substrate, a silicon carbide substrate, a silicon substrate, a gallium nitride substrate, and an aluminum nitride substrate. In this exemplary embodiment, the substrate 110 may be a patterned sapphire substrate PSS.

In the light emitting diode, the substrate 110 may be omitted. In a structure wherein the substrate 110 is used as a growth substrate for the light emitting structure, the substrate 110 may be separated or removed from the light emitting structure 120 by a technique known to a person having ordinary knowledge in the art (hereinafter, 'those skilled in the art'). The substrate 110 may be separated or removed from the light emitting structure 120 by physical and/or chemical methods, for example, laser lift-off, chemical lift-off, stress lift-off, or polishing.

The light emitting structure 120 may include the first conductive type semiconductor layer 121, the active layer 123 disposed on the first conductive type semiconductor layer 121, and the second conductive type semiconductor layer 125 disposed on the active layer 123. In addition, the light emitting diode may include a light emitting unit 121c disposed on the first conductive type semiconductor layer 121 and including the active layer 123 and the second conductive type semiconductor layer 125. The light emitting unit 121c may be provided in plural and each of the light emitting units 121c may include one or more contact holes 127. The light emitting diode may include an additional contact region 129 formed in a region surrounded by the light emitting units 121c.

The first conductive type semiconductor layer 121, the active layer 123 and the second conductive type semiconductor layer 125 may include a III-V based compound semiconductor, for example, a nitride semiconductor such as (Al, Ga, In)N. The first conductive type semiconductor layer 121 may include an n-type dopant (for example, Si) and the second conductive type semiconductor layer 125 may include a p-type dopant (for example, Mg), or vice versa. The active layer 123 may include a multi-quantum well (MQW) structure.

The light emitting unit 121c includes the active layer 123 and thus can be defined as a luminous region in operation of the light emitting diode. Further, the light emitting diode may include at least two light emitting units 121c and the additional contact region 129 may be formed in a separation region between the at least two light emitting units 121c. For example, as shown in the drawings, the light emitting diode according to this exemplary embodiment may include at least four light emitting units 121c, which are separated from one another to form a separation region 128 therebetween. Particularly, in the separations region 128, a region surrounded by the four light emitting units 121c may be defined as the additional contact region 129. Each of the light emitting units 121c may further include a portion of the first conductive type semiconductor layer 121 in addition to the active layer 123 and the second conductive type semiconductor layer 125. Here, it should be understood that other implementations are also possible and the additional contact region 129 may be formed in a separation region between two or more light emitting units 121c.

Each of the light emitting units 121c may include one or more contact holes 127, which may be formed by partially removing the second conductive type semiconductor layer 125 and the active layer 123. Accordingly, the first conductive type semiconductor layer 121 may be partially exposed through the contact holes 127. Although the number and locations of the contact holes 127 in the light emitting units 120c are not particularly limited, for example, the contact hole 127 may be disposed in a central region of each of the light emitting units 120c.

As described below, the first electrode 140 may form ohmic contact with the first conductive type semiconductor layer 121 through the contact holes 127. Accordingly, current spreading efficiency and a luminous pattern of the light emitting diode can be regulated depending upon the locations and number of contact holes 127. For example, with the structure wherein each of the contact holes 127 is disposed in the central region of the light emitting unit 120c, the light emitting structure allows uniform current spreading to each of the light emitting units 120c. However, it should be understood that the number and locations of the contact holes 127 shown in the drawings are provided for illustration only and may be designed in various way in consideration of current spreading efficiency.

On the other hand, the additional contact region 129 may be disposed in a separation region between at least two light emitting units 120c. Particularly, as shown in the drawings, the additional contact region 129 may be disposed in a region in which one corner of each of the at least four light emitting units 120c meets corners of other three light emitting units 120c. This is applied to the structure wherein each of the light emitting units 120c has a rectangular planar shape, and may also be applied to other structures wherein the light emitting units 120c have other shapes instead of the rectangular planar shape. For example, in a structure wherein the additional contact region 129 is surrounded by five or more light emitting units 120c, the additional contact region 129 may be disposed in a region in which one corner of each of the light emitting units 120c meets corners of other light emitting units 120c.

It should be understood that other implementations are also possible and the additional contact region 129 may be disposed between at least 2 light emitting units 120c, as described above. For example, in the structure wherein the additional contact region 129 is formed between two light emitting units 120c, the additional contact region 129 may be placed on an imaginary line connecting the contact hole of one light emitting unit to the contact hole of the other light emitting unit. In this structure, in order to form a space for formation of the additional contact region 129, side surfaces of the light emitting units 120c may be partially removed along the additional contact region 129.

As described below, the first electrode 140 forms ohmic contact with the first conductive type semiconductor layer 121 not only through the contact holes 127 but also through the additional contact region 129. With the structure wherein the first conductive type semiconductor layer 121 also forms ohmic contact with the first electrode 140 through the additional contact region 129 dispose in the separation region between at least two light emitting units 120c, the light emitting diode can have further improved current spreading efficiency.

Particularly, in this exemplary embodiment, distances from the center of the additional contact region 129 to the centers of the four light emitting units 120c may be substantially the same, and the contact hole 127 may be disposed in a central region of each of the light emitting units 120c. With this structure, the light emitting diode can have improved current spreading efficiency by the additional contact region 129 and the contact holes 127, thereby improving overall luminous uniformity.

Furthermore, the luminous region is divided by the light emitting units 120c and a contact region between the first conductive type semiconductor layer 121 and the first electrode 140 is disposed in a region between the light emitting units 120c, whereby the light emitting diode can have reduced forward voltage Vf.

In this exemplary embodiment, the light emitting diode is illustrated as including four light emitting units 120c. However, it should be understood that other implementations are also possible and light emitting diodes according to other exemplary embodiments of the present disclosure may include at least two or at least five light emitting units 120c.

Figure 4:
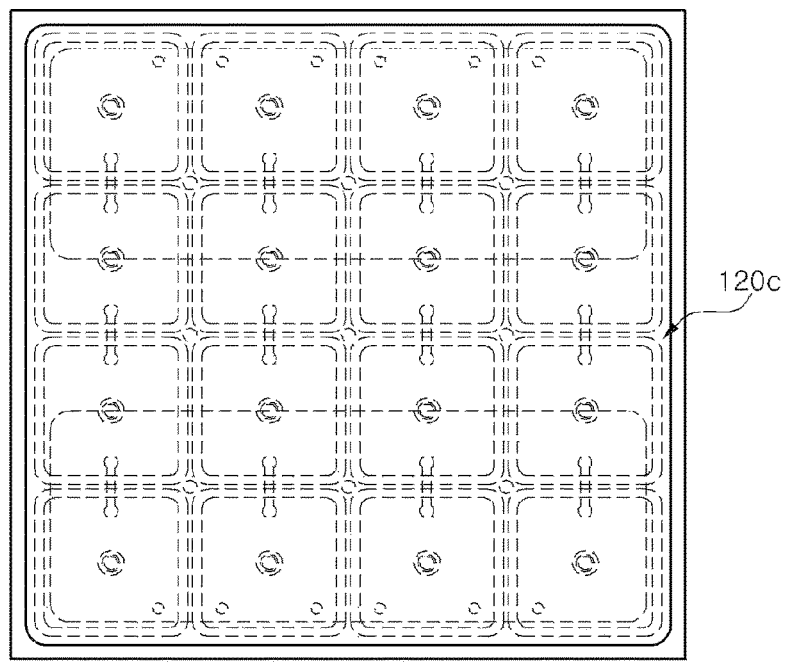
FIG. 4 is a plan view of a light emitting diode according to another exemplary embodiment of the present disclosure.

For example, as shown in FIG. 4, a light emitting diode including more light emitting units 120c also falls within the scope of the inventive concept of the present disclosure. Referring to FIG. 4, the light emitting diode may include sixteen light emitting units 120c and additional contact regions 129 formed in regions each surrounded by four adjacent light emitting units 120c. Thus, according to exemplary embodiments of the present disclosure, the light emitting diode including more light emitting units 120c can have improved current spreading efficiency.

Referring again to FIG. 1 to FIG. 3, the second electrode 131 is disposed on each of the light emitting units 120c and may partially cover an upper surface of the second conductive type semiconductor layer 125 while forming ohmic contact therewith. Particularly, the second electrodes 131 may cover most of the upper surface of the second conductive type semiconductor layer 125, whereby light emitted from the active layer 123 can be effectively emitted and each of the light emitting units 120c can have improved current spreading efficiency.

The second electrode 131 is not formed in a region corresponding to the contact hole 127 and thus is insulated from the first conductive type semiconductor layer 121. Each the contact hole 127 may be generally formed in a central region of each the second electrode 131. With this structure, in operation of the light emitting diode, when electric current is applied to the first electrode 140 and the second electrodes 131 connected to each other through the contact holes 127, the light emitting diode can have improved current spreading efficiency.

The second electrodes 131 may include a reflective layer and a cover layer covering the reflective layer.

As described above, the second electrodes 131 can serve to reflect light while forming ohmic contact with the second conductive type semiconductor layer 125. Accordingly, the reflective layer may include a metal having high reflectivity and capable of forming ohmic contact with the second conductive type semiconductor layer 125. For example, the reflective layer may include at least one of Ni, Pt, Pd, Rh, W, Ti, Al, Ag, and Au. Further, the reflective layer may be composed of a single layer or multiple layers.

The cover layer can prevent interdiffusion between the reflective layer and other materials while preventing damage to the reflective material through diffusion of external material to the reflective layer. Thus, the cover layer may be formed to cover a lower surface and a side surface of the reflective layer. The cover layer may be electrically connected to the second conductive type semiconductor layer 125 together with the reflective layer and thus can act as an electrode together with the reflective layer. The cover layer may include at least one of, for example, Au, Ni, Ti, and Cr, and may be composed of a single layer or multiple layers.

Alternatively, the second electrodes 131 may include a transparent conductive material. The transparent conductive material can form ohmic contact with the second conductive type semiconductor layer 125 and may include at least one of, for example, ITO, ZnO, IZO and Ni/Au. In the structure wherein the second electrodes 131 include a transparent conductive material, the upper insulation layer 153 described below may include a reflective layer in order to provide a reflection function.

Referring again to FIG. 1 to FIG. 3, the light emitting diode may further include a lower insulation layer 151. The lower insulation layer 151 may at least partially cover the light emitting units 120c and a reflective metal layer 131. In addition, the lower insulation layer 151 may be formed to cover side surfaces of the contact holes 127 while exposing lower surfaces of the contact holes 127 such that the first conductive type semiconductor layer 121 can be partially exposed through the contact holes 127. Furthermore, the lower insulation layer 151 may cover a side surface of the light emitting structure 120.

The lower insulation layer 151 may include first openings disposed corresponding to the contact holes 127 and the additional contact region 129, and second openings partially exposing the second electrodes 131. The first conductive type semiconductor layer 121 may be electrically connected to the first electrode 140 through the first openings and the contact holes 127. The second electrodes 131 may be electrically connected to the second pad 163 through the second openings. In addition, the second openings may provide regions in which the connection layer 133 is formed.

The lower insulation layer 151 may include an insulation material, for example, $SiO_2$ or $SiN_x$. Furthermore, the lower insulation layer 151 may have a multilayer structure and may include a distributed Bragg reflector in which material layers having different refractive indices are alternately stacked one above another. Particularly, in the structure wherein the second electrodes 131 include a transparent conductive material, the lower insulation layer 151 may include a reflective material or the distributed Bragg reflector. With this structure, the lower insulation layer 151 serves to reflect light, thereby improving luminous efficacy of the light emitting diode.

The first electrode 140 may be disposed on the light emitting structure 120 and may at least partially cover the light emitting units 120c. In addition, the first electrode 140 may be disposed on the contact holes 127 and the additional contact region 129 to form ohmic contact with the first conductive type semiconductor layer 121. The first electrode 140 is not formed on the second openings of the lower insulation layer 151, that is, in regions to which the second electrodes 131 are exposed.

The first electrode 140 may be formed to cover the entirety of the light emitting units excluding some region of the lower insulation layer 151, and particularly, may be formed to cover the side surfaces of the light emitting units 120c and the side surface of the first conductive type semiconductor layer 121.

With the structure wherein the first electrode 140 is formed to cover the entirety of the light emitting units excluding some region, the light emitting diode can have further improved current spreading efficiency. Furthermore, since the first electrode 140 can cover a portion not covered by the second electrodes 131, the first electrode 140 can reflect light traveling toward the side surface of the light emitting structure 120, thereby improving luminous efficacy of the light emitting diode. Furthermore, the first electrode 140 is also formed on the side surface of the light emitting structure 120 and thus can reflect light emitted through the side surface of the active layer 123, thereby improving luminous efficacy of the light emitting diode.

The first electrode 140 forms ohmic contact with the first conductive type semiconductor layer 121 and can serve to reflect light, as described above. The first electrode 140 may be composed of a single layer or multiple layers including at least one of Ni, Pt, Pd, Rh, W, Ti, Al, Ag and Au. For example, the first electrode 140 may include a highly reflective metal layer such as an Al layer, and the highly reflective metal layer may be bonded to a bonding layer formed of Ti, Cr or Ni.

The first electrode 140 may be insulated from the second electrodes 131 and the side surface of the light emitting structure 120, for example, by the lower insulation layer 151 interposed between the first electrode 140 and the second electrodes 131.

The light emitting diode may further include the connection layer 133.

The connection layer 133 may electrically connect the second electrode 131 disposed on one of the light emitting units 120c to the second electrode 131 disposed on another light emitting unit 120c adjacent to the one light emitting unit. For example, the connection layer 133 may electrically connect the second electrodes 131 disposed on adjacent light emitting units 120c to each other through at least two second openings of the lower insulation layer 151.

The connection layer 133 may electrically connect the second electrodes 131 disposed on at least two light emitting units 120c to each other, and may electrically connect the second electrodes 131 disposed on all of the light emitting units 120c to each other. For example, as shown in the drawings, the connection layer 133 may connect two light emitting units 120c linearly arranged in the vertical direction to each other in a linear arrangement, or alternatively, may connect three or more light emitting units 120c to one another. However, it should be understood that other implementations are also possible.

At least two reflective electrode layers 131 may be connected in parallel by the connection layer 133. With this structure, the light emitting diode has improved current spreading efficiency between a plurality of reflective electrode layers 131, thereby improving overall current spreading efficiency and luminous uniformity of the light emitting diode.

The connection layer 133 may include an electrically conductive material, for example, a metal. In addition, the connection layer 133 may be formed of the same material as the first electrode 140. Furthermore, an upper surface of the connection layer 133 may be substantially coplanar with an upper surface of the first electrode 140.

The upper insulation layer 153 may at least partially cover the first electrode 140 and the connection layer 133. The upper insulation layer 153 may include a third opening at least partially exposing the first electrode 140 and a fourth opening at least partially exposing the second electrode 131.

Each of the third and fourth openings may be formed singularly or in plural. Further, in a structure wherein the third opening is disposed near one edge of the light emitting diode, the fourth opening may be disposed near the opposite edge thereof. The third and fourth openings partially expose the first and second electrodes 140, 131 to provide paths through which the first and second pads 161, 163 are electrically connected to the first and second electrodes 140, 131, respectively.

The upper insulation layer 153 may include an insulation material, for example, $SiO_2$ or $SiN_x$. Furthermore, the upper insulation layer 153 may have a multilayer structure and may include a distributed Bragg reflector in which material layers having different refractive indices are alternately stacked one above another.

On the other hand, the upper insulation layer 153 may be formed of a different material from the lower insulation layer 151. For example, the lower insulation layer 151 may include $SiO_2$ and the upper insulation layer 153 may include $SiN_x$. Further, the lower insulation layer 151 may have a greater thickness than the upper insulation layer 153. With the lower insulation layer 151 having a relatively thick thickness, the light emitting structure 120 can be more effectively electrically protective and can prevent damage due to external moisture.

The light emitting diode may further include a first pad 161 and a second pad 163.

The first pad 161 may be disposed on the upper insulation layer 153 and is electrically connected to a first electrode 140 through the third opening. The second pad 163 may be disposed on the upper insulation layer 153 and is electrically connected to a second electrode 131 through the fourth opening. With this structure, the first and second pads 161, 163 are electrically connected to the first and second conductive type semiconductor layers 121, 125, respectively. Accordingly, the first and second pads 161, 163 can serve as electrodes through which external power is supplied to the light emitting diode.

The first pad 161 and the second pad 163 are spaced apart from each other and may include a bonding layer formed of, for example, Ti, Cr, or Ni, and a highly conductive metal layer formed of, for example, Al, Cu, Ag or Au, without being limited thereto.

According to other exemplary embodiments, the light emitting diode may further include a heat dissipation pad (not shown).

The heat dissipation pad may be disposed on the upper insulation layer 153 and may be electrically insulated from the light emitting structure 120. In addition, the heat dissipation pad may be interposed between the first and second pads 161, 163 and may be electrically insulated therefrom. The heat dissipation pad may include a material having high thermal conductivity, for example, Cu.

With the heat dissipation pad, the light emitting diode can effectively dissipate heat generated upon light emission and can improve lifespan and reliability of a high power large flip-chip-type light emitting diode. In addition, it is possible to prevent deterioration of the light emitting diode caused by heat generation upon operation of the light emitting diode. Furthermore, the heat dissipation pad is disposed on the upper insulation layer 153 to be insulated from the light emitting structure 120, thereby preventing occurrence of electrical problems (for example, short circuit) caused by the heat dissipation pad.

FIG. 5A to FIG. 11B are a plan view and cross-sectional views illustrating a method of manufacturing a light emitting diode according to a further exemplary embodiment of the present disclosure.

The manufacturing method described with reference to FIG. 5A to FIG. 11B can provide the light emitting diode as described with reference to FIG. 1 to FIG. 3. Accordingly, detailed descriptions of the same components as those of the exemplary embodiment described in FIG. 1 to FIG. 3 will be omitted. Thus, exemplary embodiments of the present disclosure are not limited by the following description.

In each of FIG. 5A to FIG. 11B, are a plan view and a cross-sectional view. In FIG. 5A to FIG. 11B, each of the cross-sectional views is taken along line C-C of the corresponding plan view.

Figure 5A:
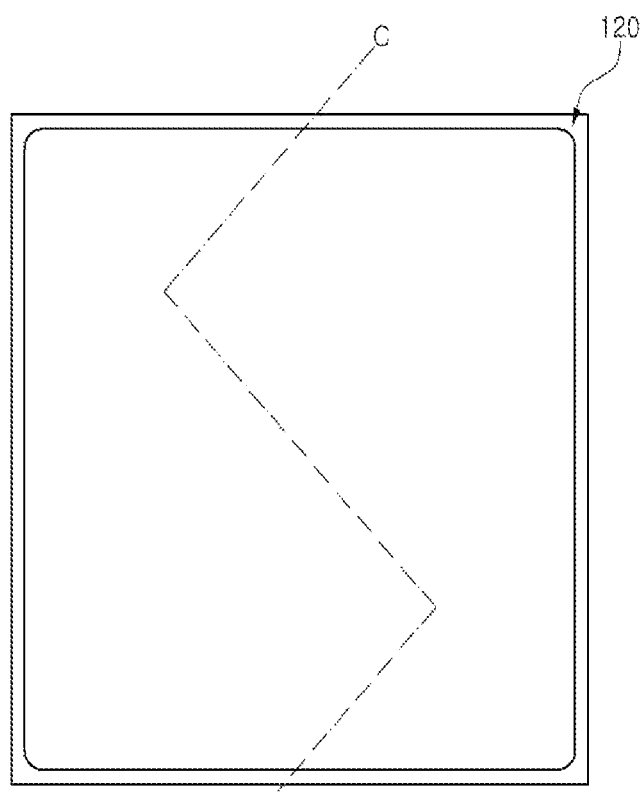
FIG. 5A to FIG. 11B are plan views and cross-sectional views illustrating a method of manufacturing a light emitting diode according to a further exemplary embodiment of the present disclosure.
Figure 5B:
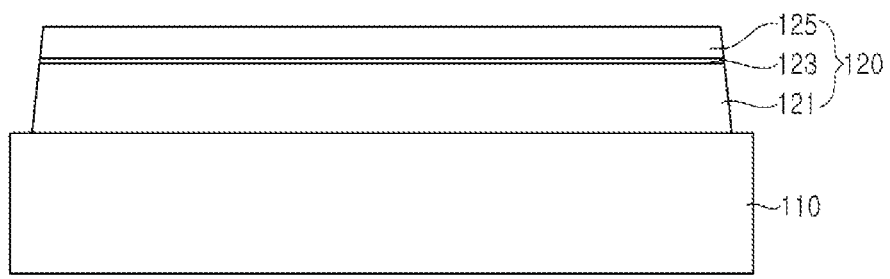

First, referring to FIGS. 5A and 5B, a light emitting structure 120 including a first conductive type semiconductor layer 121, an active layer 123 and a second conductive type semiconductor layer 125 are formed on a substrate 110.

The substrate 110 may be any substrate that allows growth of the light emitting structure 120 thereon, and may include, for example, a sapphire substrate, a silicon carbide substrate, a silicon substrate, a gallium nitride substrate, and an aluminum nitride substrate. In this exemplary embodiment, the substrate 110 may be a patterned sapphire substrate PSS.

The first conductive type semiconductor layer 121, the active layer 123, and the second conductive type semiconductor layer 125 may be sequentially formed in the stated order. The light emitting structure 120 may include a nitride semiconductor and may be formed by a typical method of growing nitride semiconductors, such as MOCVD, HVPE, MBE, and the like, which are well known to those skilled in the art. Before growth of the first conductive type semiconductor layer 121, a buffer layer (not shown) may be further grown on the substrate 110.

Figure 6A:
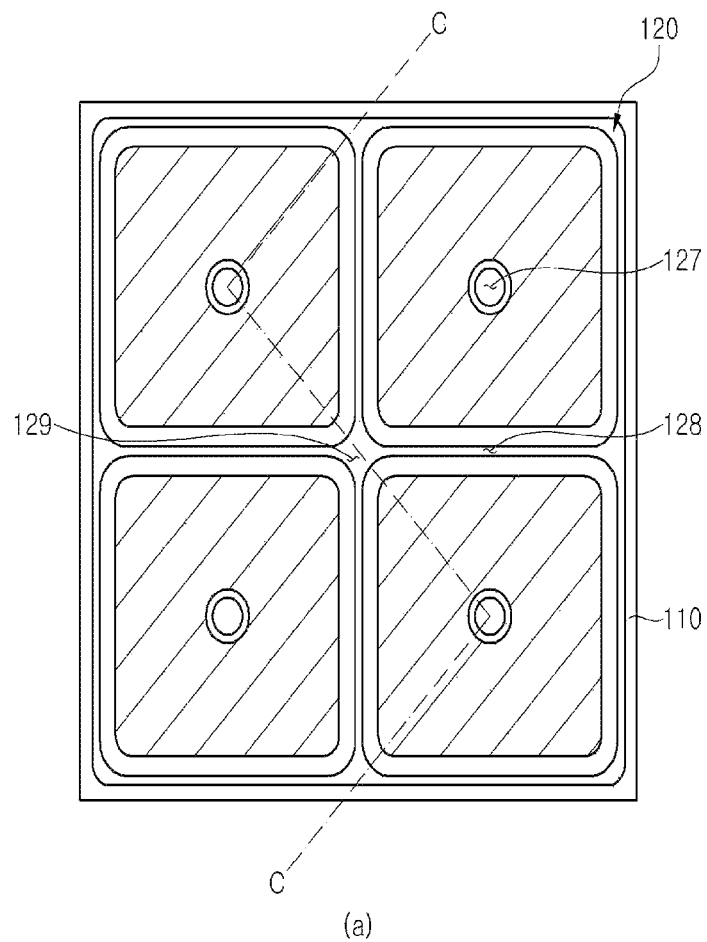
Figure 6B:
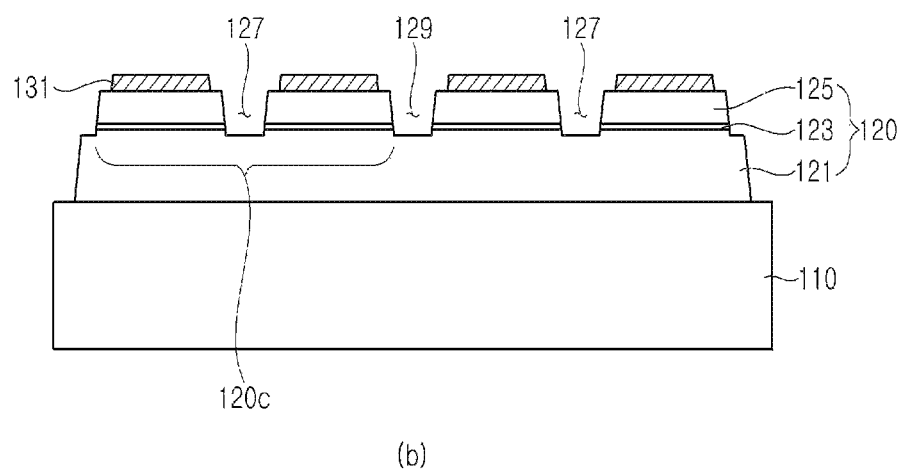

Next, referring to FIGS. 6A and 6B, light emitting units 120c and second electrodes 131 are formed. After the light emitting units 120c are formed, the second electrodes 131 may be formed, or vice versa.

The light emitting units 120c may be formed by forming a separation region 128 through partial removal of the second conductive type semiconductor layer 125 and the active layer 123. Formation of the separation region 128 may include forming an additional contact region 129. Formation of the light emitting units 120c may include forming contact holes 127 by removing the second conductive type semiconductor layer 125 and the active layer 123 in some regions of the light emitting units 120c. In the above processes, the second conductive type semiconductor layer 125 and the active layer 123 are removed, whereby the first conductive type semiconductor layer 121 can be partially exposed.

At least two light emitting units 120c may be formed and may be disposed such that the additional contact region 129 is disposed in a region between the at least two light emitting units 120c. For example, as shown in the drawings, four light emitting units 120c having a quadrangular planar shape may be arranged in a 2×2 matrix. With this structure, the additional contact region 129 may be formed in a region in which one corner of each of the four light emitting units 120c meets corners of other three light emitting units 120c. However, it should be understood that other implementations are also possible.

The separation region 128 partitioning the light emitting units 120c, the additional contact region 129 and the contact holes 127 may be formed by etching and photolithography. For example, with an etching region defined by a photoresist pattern, the regions 128, 129 and the contact holes 127 may be formed by dry etching such as ICP.

The contact hole 127 may be formed in a central region of each of the light emitting units 120c. Further, the additional contact region 129 may be formed such that distances from the center of the additional contact region 129 to the centers of the four light emitting units 120c are substantially the same.

The second electrodes 131 may be formed by deposition of a metallic material and etching, or alternatively, by deposition of the metallic material and lift-off. The second electrode 131 on each of the light emitting units 120c may be formed to surround the contact hole 127, whereby the contact holes 127 are exposed.

The second electrodes 131 may be formed to cover most of an upper surface of the second conductive type semiconductor layer 125 of the light emitting units 120c.

Figure 7A:
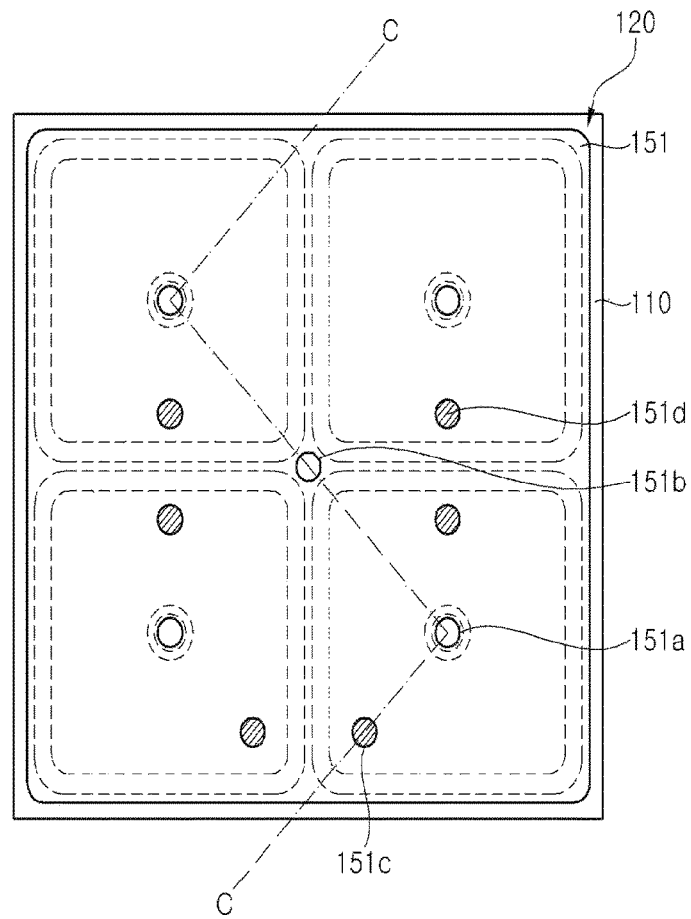
Figure 7B:
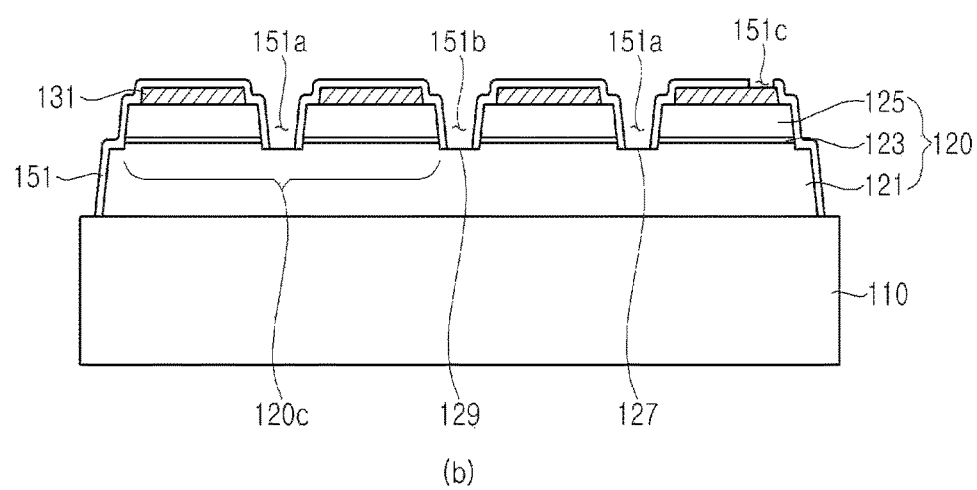

Next, referring to FIGS. 7A and 7B, a lower insulation layer 151 may be formed to cover the light emitting units 120c and the second electrodes 131. Further, the lower insulation layer 151 may be formed to cover side surfaces of the contact holes 127, particularly, side surfaces of the second conductive type semiconductor layer 125 and the active layer 123 exposed to the side surfaces of the contact holes 127.

The lower insulation layer 151 may include first openings 151a, 151b partially exposing the first conductive type semiconductor layer 121 and second openings 151c, 151d partially exposing the second electrodes 131. Further, the first openings 151a, 151b may include openings 151a exposing a bottom surface of each of the contact holes 127 and an opening 151b at least partially exposing the additional contact region 129, and the second openings 151c, 151d may include openings 151c for formation of a second pad 163 and openings 151d for formation of connection layers 133. Locations of the second openings 151c, 151d may be determined based on the location of the second pad 163 and the number and locations of the connection layers 133.

The lower insulation layer 151 may be formed by deposition and patterning of an insulation material such as $SiO_2$, or alternatively, by deposition and lift-off.

Figure 8A:
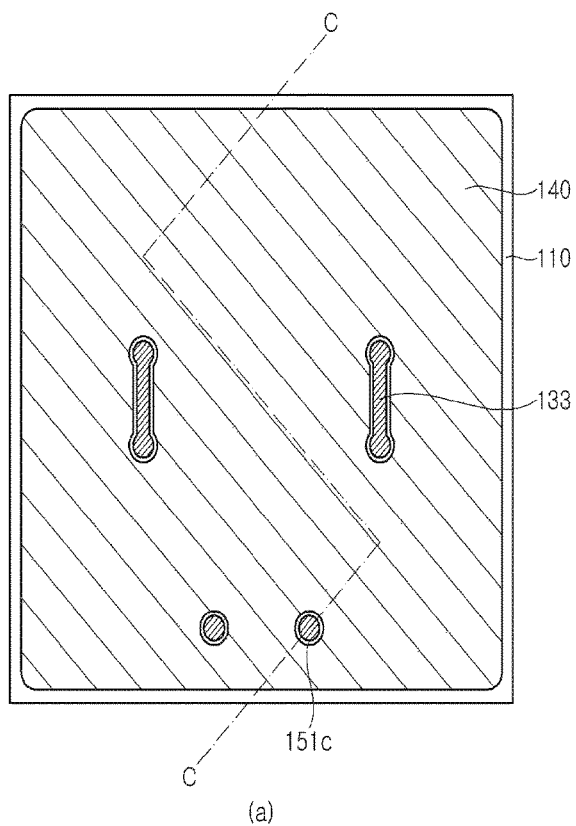
Figure 8B:
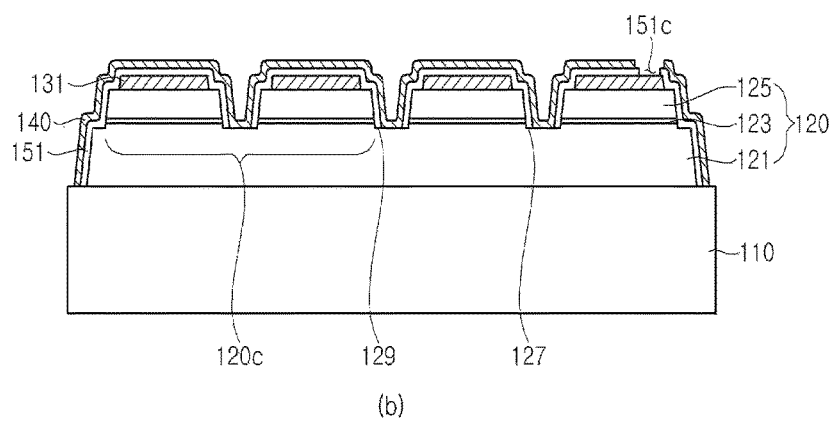

Referring to FIGS. 8A and 8B, a first electrode 140 is formed to cover the at least four light emitting units 120c and the lower insulation layer 151. In addition, the connection layers 133 may be formed to electrically connect at least two second electrodes 131 to each other.

The first electrode 140 may be formed by deposition and patterning of a metallic material, and fills the first openings 151a, 151b to form ohmic contact with the first conductive type semiconductor layer 121 through the contact holes 127 and the additional contact region 129. On the other hand, the first electrode 140 is not formed on the second openings 151c, 151d. With this structure, the first electrode 140 is insulated from the second electrode 131 and the second conductive type semiconductor layer 125.

In addition, the first electrode 140 and the connection layers 133 may be formed at the same time by the same deposition process. For example, the first electrode 140 and the connection layers 133 may be formed by depositing a metallic material so as to cover the entirety of the light emitting structure 120 and the lower insulation layer 151, followed by patterning or lift-off so as to divide the light emitting structure 120 and the lower insulation layer 151. Accordingly, the first electrode 140 and the connection layers 133 may include the same material. Further, an upper surface of the first electrode 140 may be coplanar with upper surfaces of the connection layers 135.

Figure 9A:
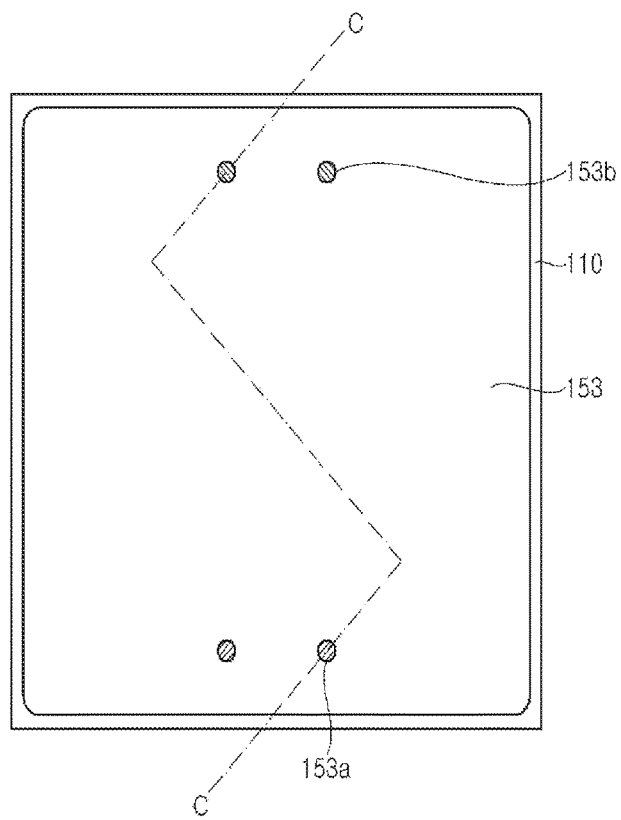
Figure 9B:
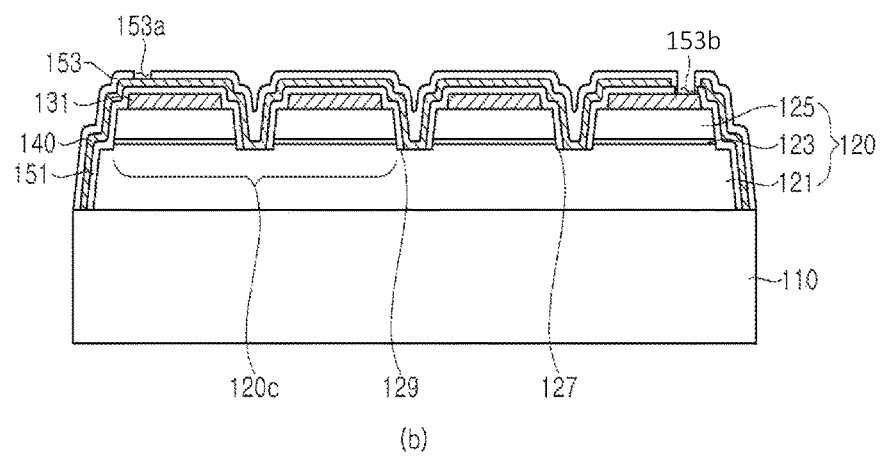

Next, referring to FIGS. 9A and 9B, an upper insulation layer 153 may be formed to cover at least part of the first electrode 140 and the connection layers 133.

The upper insulation layer 153 may include third openings 153a partially exposing the first electrode 140 and fourth openings 153b at least partially exposing the second electrode 131. Here, the fourth openings 153b may be disposed corresponding to the openings 151c exposing the second electrodes 131. The upper insulation layer 153 may be formed by deposition and patterning of an insulation material such as $SiO_2$.

Particularly, the upper insulation layer 153 is formed to fill a separation region between the first electrode 140 and the connection layers 133, thereby reinforcing electrical insulation between the first electrode 140 and the connection layers 133.

The third openings 153a may be disposed near one edge of the light emitting diode and the fourth openings 153b may be disposed near the opposite edge thereof. That is, the third and fourth openings 153a, 153b may be formed so as to be disposed near the opposite edges of the light emitting diode, respectively, as shown in the drawings.

Figure 10A:
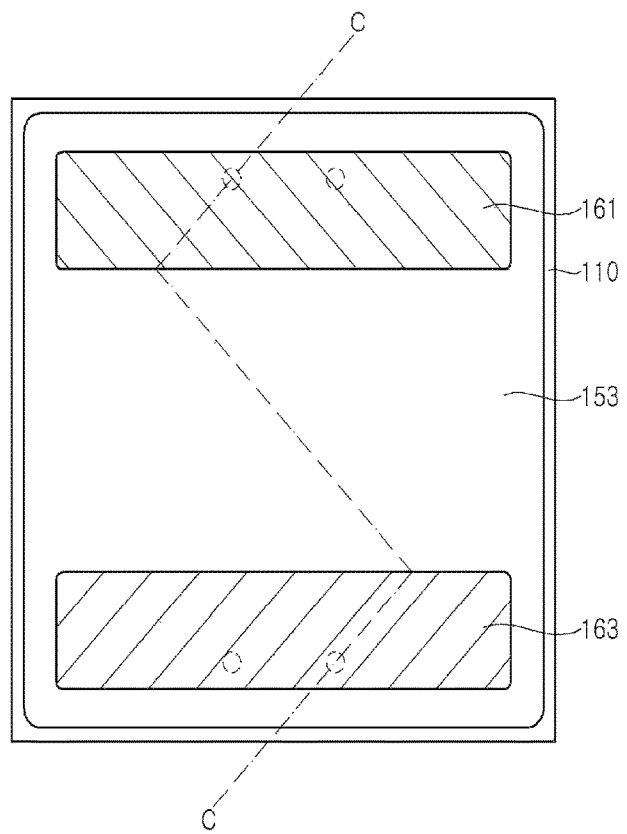
Figure 10B:
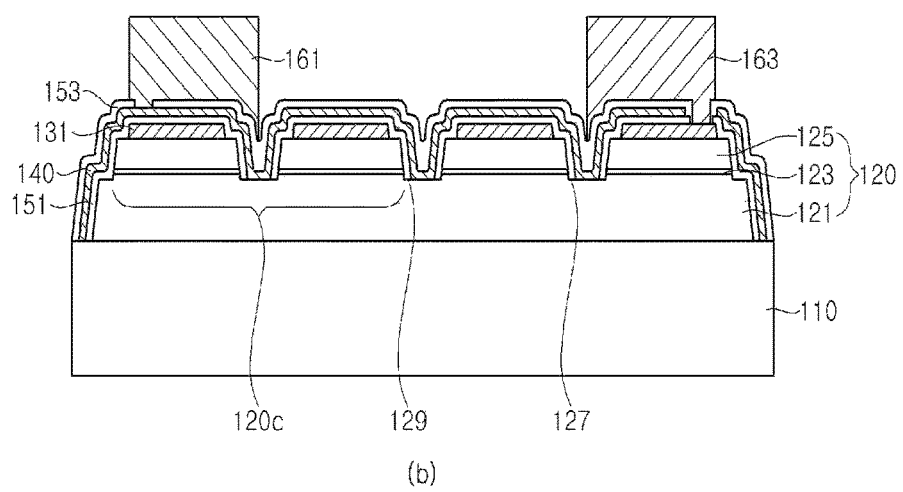

Next, referring to FIGS. 10A and 10B, a first pad 161 and a second pad 163 may be formed on the upper insulation layer 153. As a result, the light emitting diode as shown in FIG. 1 to FIG. 4 can be provided.

The first pad 161 may be formed on the third openings 153a to fill the third openings 153a therewith and thus can be electrically connected to a first electrodes 140. Likewise, the second pad 163 may be formed on the fourth openings 153b to fill the fourth openings 153b therewith and thus can be electrically connected to second electrodes 131. The first pad 161 and the second pad 163 may be used as pads for bump connection or SMT in order to mount the light emitting diode on a sub-mount, a package, a printed circuit board, and the like.

The first and second pads 161, 163 may be formed at the same time by the same process, for example, by photolithography and etching or lift-off.

In addition, the manufacturing method may further include separating the substrate 110 from the light emitting structure 120. The substrate 110 can be separated or removed therefrom by physical and/or chemical processes.

Figure 11A:
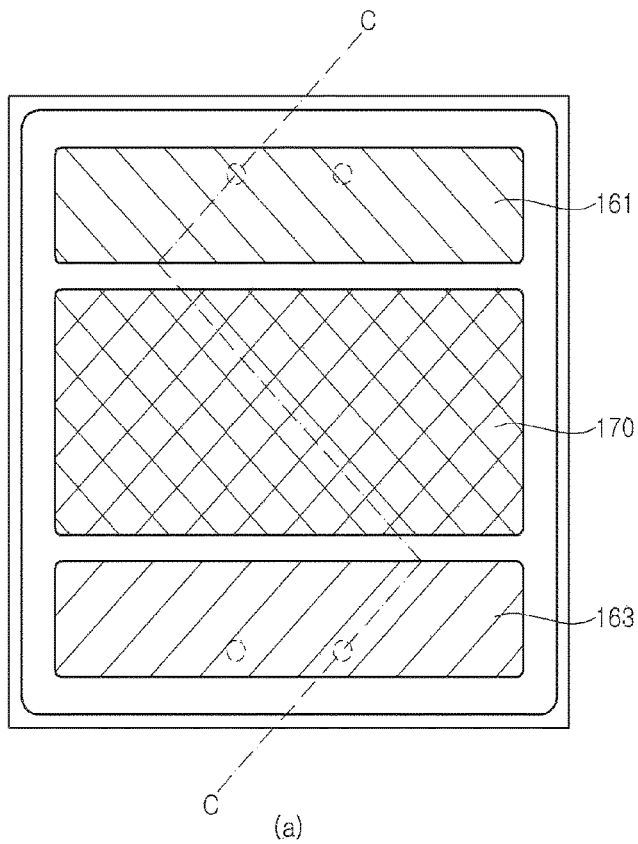
Figure 11B:
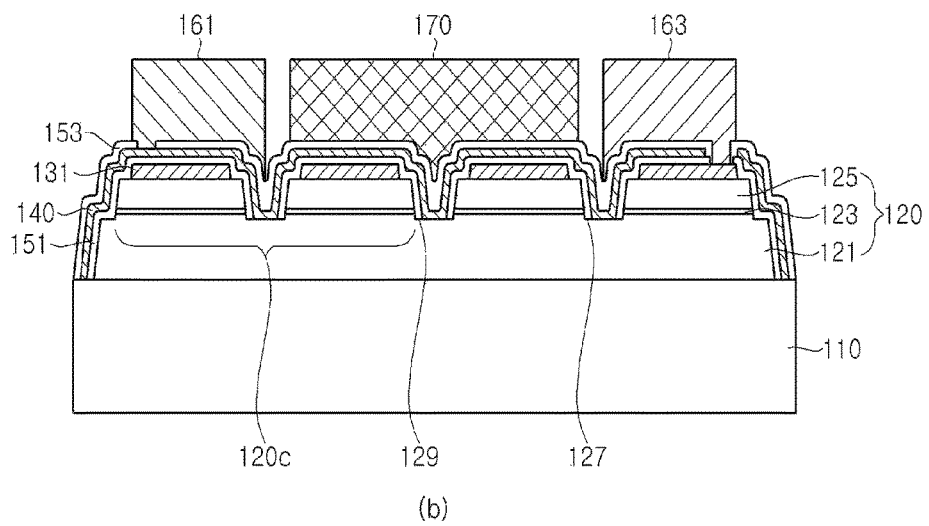

In addition, the manufacturing method may further include forming a heat dissipation pad 170 on the upper insulation layer 153, as shown in FIGS. 11A and 11B. The heat dissipation pad 170 may be formed by a similar process to the process of forming the first and second pads 161, 163, for example, by plating, electroplating or deposition. Furthermore, the heat dissipation pad 170 may be formed simultaneously with the first and second pads 161, 163.

FIG. 12 to FIG. 16 are a plan view and cross-sectional views of a light emitting diode according to yet another exemplary embodiment of the present disclosure.

Figure 12:
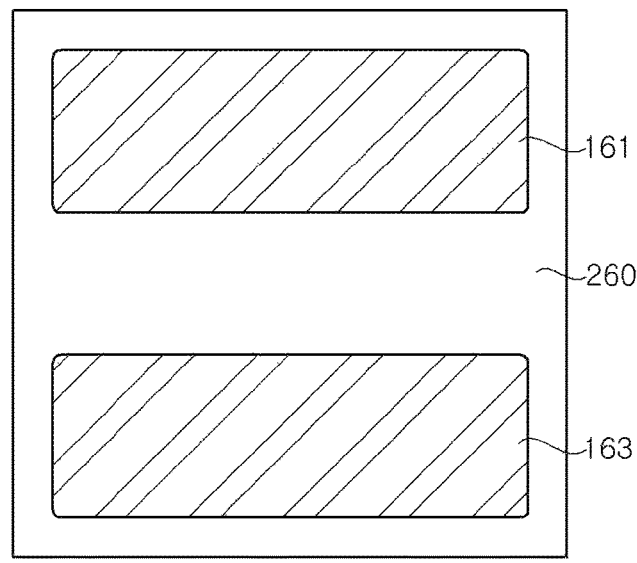
FIG. 12 to FIG. 16 are plan views and cross-sectional views of a light emitting diode according to yet another exemplary embodiment of the present disclosure.
Figure 13:
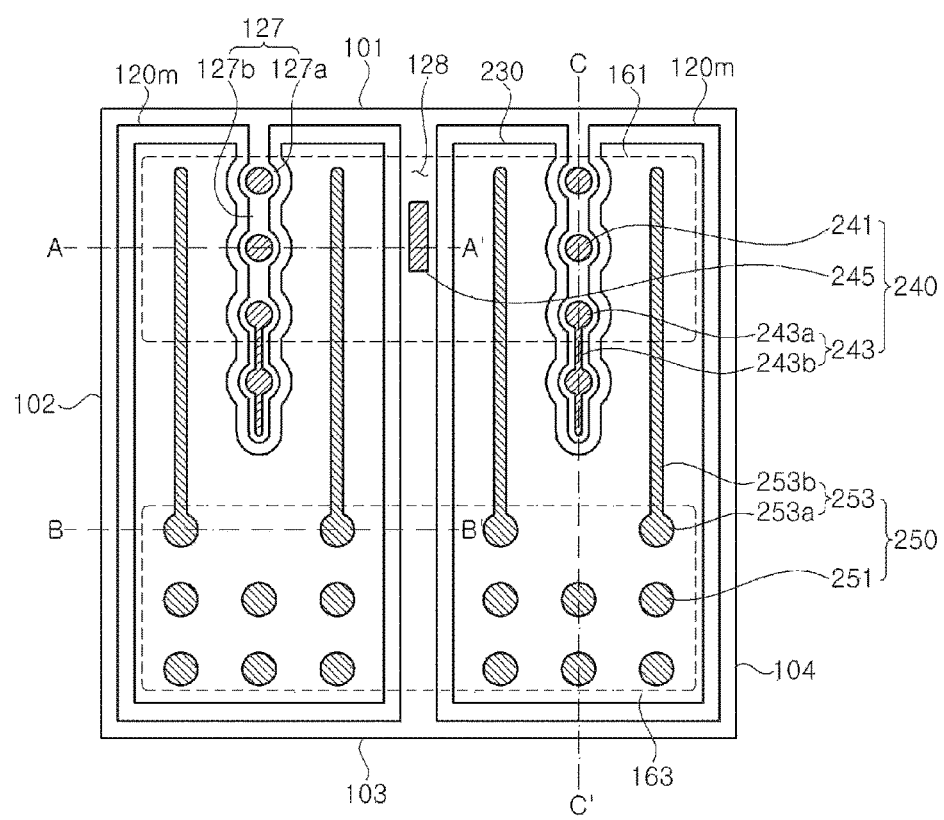
Figure 14:
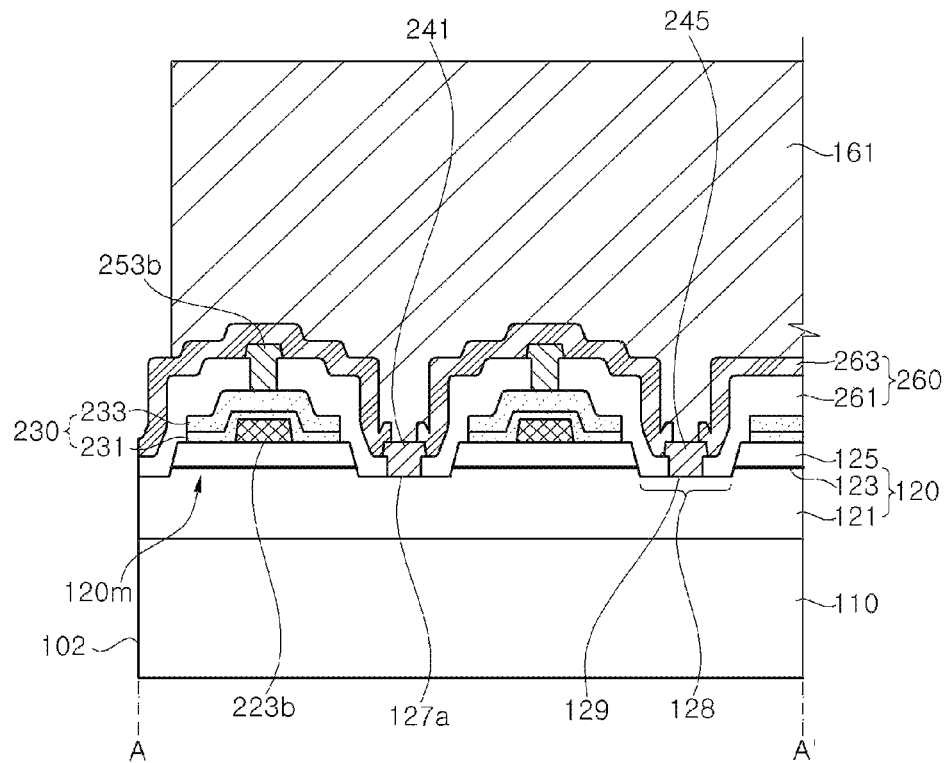
Figure 15:
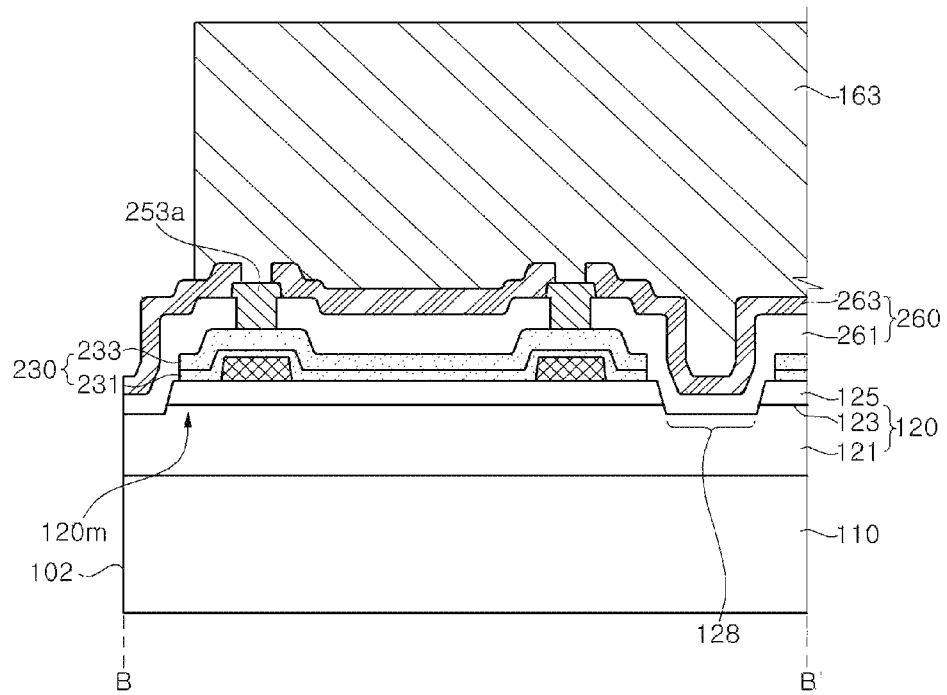
Figure 16:
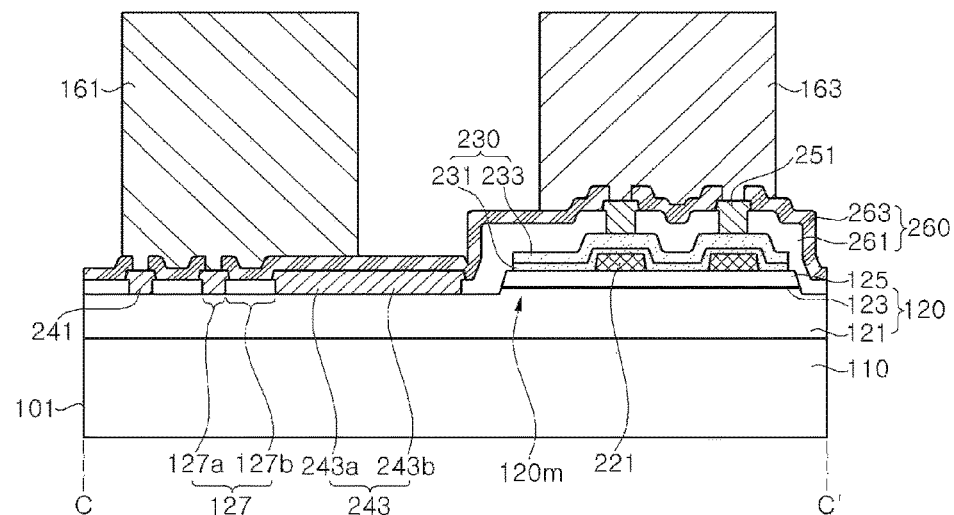
Figure 17:
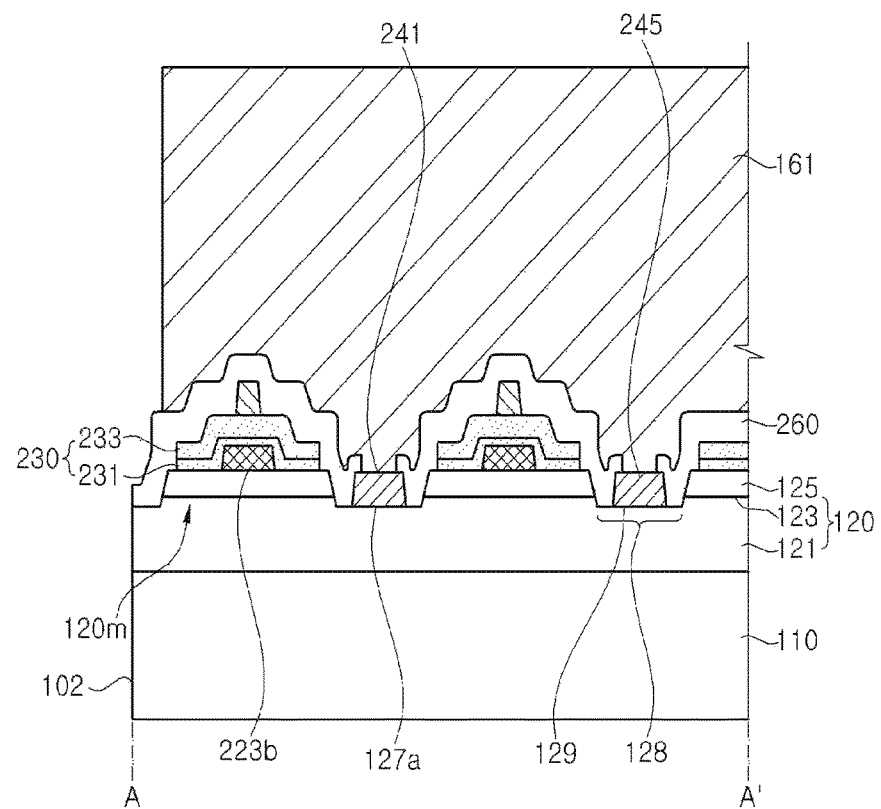
FIG. 17 is a cross-sectional view of a light emitting diode according to yet another exemplary embodiment of the present disclosure.

FIG. 12 is a plan view of the light emitting diode. FIG. 13 is a plan view of the light emitting diode, in which a first pad 161, a second pad 163 and an insulation layer 260 are omitted for convenience of description. FIG. 14 is a cross-sectional view taken along line A-A' of FIG. 13, FIG. 15 is a cross-sectional view taken along line B-B' of FIG. 13, and FIG. 16 is a cross-sectional view taken along line C-C' of FIG. 13. Detailed descriptions of the same or similar components to those of the exemplary embodiments described above will be omitted and the following description will focus on different features of this exemplary embodiment.

Referring to FIG. 12 to FIG. 16, the light emitting diode according to this exemplary embodiment includes a light emitting structure 120, a current spreading layer 230, first electrodes 240, second electrodes 250, and an insulation layer 260. In addition, the light emitting diode may further include a substrate 110, a current blocking layer 220, a first pad 161, and a second pad 163. The light emitting diode may have a quadrangular planar shape. In this exemplary embodiment, the light emitting diode has a square planar shape, and may include a first side surface 101, a second side surface 102, a third side surface 103 opposite the first side surface 101, and a fourth side surface 104 opposite the second side surface 102.

The substrate 110 is similar to the substrate described with reference to FIG. 1 to FIG. 3 and may also be omitted in this exemplary embodiment.

The light emitting structure 120 may include a first conductive type semiconductor layer 121, an active layer 123 disposed on the first conductive type semiconductor layer 121, and a second conductive type semiconductor layer 125 disposed on the active layer 123. In addition, the light emitting structure 120 may include a plurality of mesas 120m and a separation region 128 formed between the mesas 120m. Although the number and shape of the mesas 120m are not particularly limited, the light emitting structure 120 may include, for example, two mesas 120m, as shown in FIG. 13. The two mesas 120m are disposed in a substantially symmetrical arrangement and each of the mesas 120m may have an elongated shape extending from the first side surface 101 towards the third side surface 103. Accordingly, the separation region 128 may also have an elongated shape extending from the first side surface 101 towards the third side surface 103.

The mesas 120m may be disposed on the first conductive type semiconductor layer 121 and include the second conductive type semiconductor layer 125 and the active layer 123. Since the mesas 120m include the active layer 123, the mesas 120m according to this exemplary embodiment can also be defined as luminous regions like the light emitting units 121c of the above embodiment shown in FIG. 1 to FIG. 3. In addition, each of the mesas 120m may include at least one contact hole 127, through which the first conductive type semiconductor layer 121 may be exposed. The first electrodes 240 may be electrically connected to the first conductive type semiconductor layer 121 through the at least one contact hole 127.

The number and shape of the contact holes 127 may be controlled or modified depending upon spreading of electric current applied to the light emitting diode and luminous patterns thereof. For example, the contact hole 127 may be formed to extend from one side surface of the mesa 120m to a center thereof. In addition, the contact hole 127 may include a main contact hole 127a having a relatively large width and a secondary contact hole 127b having a relatively small width.

In this exemplary embodiment, the contact hole 127 may extend from a side surface of the mesa 120m adjacent to the first side surface 101 among the side surfaces of the mesa 120m towards the third side surface 103. In addition, the contact hole 127 includes a plurality of main contact holes 127a and a plurality of secondary contact holes 127b. The secondary contact holes 127b may connect the main contact holes 127a to each other or may extend from the main contact holes 127a. For example, as shown in the drawings, four main contact holes 127a are spaced apart from one another and the secondary contact holes 127b may be disposed to connect the four main contact holes 127a to one another and may be disposed so as to extend from the main contact holes 127a disposed at a distal end. At least some of the main contact holes 127a may be disposed under the first pad 161.

In this exemplary embodiment, the contact hole 127 may extend from a side surface of the mesa 120m adjacent to the first side surface 101 among the side surfaces of the mesa 120m towards the third side surface 103. In addition, the contact hole 127 includes a plurality of main contact holes 127a and a plurality of secondary contact holes 127b. The secondary contact holes 127b may connect the main contact holes 127a to each other or may extend from the main contact holes 127a. For example, as shown in the drawings, four main contact holes 127a are spaced apart from one another and the secondary contact holes 127b may be disposed to connect the four main contact holes 127a to one another and may be disposed so as to extend from the main contact holes 127a disposed at a distal end. At least some of the main contact holes 127a may be disposed under the first pad 161.

Further, the mesas 120m include the additional contact region 129 disposed in the separation region 128. The first electrode 240, particularly, a third ohmic contact electrode 245 of the first electrode 240, is electrically connected to the first conductive type semiconductor layer 121 through the additional contact region 129, as will be described below in more detail. The location of the additional contact region 129 may be determined such that distances from the additional contact region 129 to the plural mesas 120*m* are substantially constant. The additional contact region 129 may be disposed under the first pad 161.

The current blocking layer 220 may be partially disposed on the mesa 120*m*. Particularly, the current blocking layer 220 may be disposed corresponding to the second electrode 250. The current blocking layer 220 may include a first current blocking layer 221 and a second current blocking layer 223, which may be disposed at locations corresponding to a first connection electrode 251 and a second connection electrode 253 of the second electrode 250, respectively. In addition, the second current blocking layer 223 may include a main current blocking layer 223*a* and a secondary current blocking layer 223*b* which are disposed at locations corresponding to a main electrode 253*a* and an extension electrode 253*b* of the second connection electrode 253.

The current blocking layer 220 can prevent occurrence of current crowding under the second electrode 250 due to direct supply of electric current to the second conductive type semiconductor layer 125. Accordingly, the current blocking layer 220 may have electrical insulation properties, may include an insulation material, and may be composed of a single layer or multiple layers. For example, the current blocking layer 130 may include $SiO_x$ or $SiN_x$, or may include a distributed Bragg reflector in which material layers having different refractive indices are alternately stacked one above another. The current blocking layer 220 may have light transmittance, light reflectivity, or selective light reflectivity. Further, the current blocking layer 220 may have a larger area than the second electrode 250 formed thereon. Accordingly, the second electrode 250 may be disposed above a region in which the current blocking layer 220 is formed.

The current spreading layer 230 may be disposed on the second conductive type semiconductor layer 125, that is, on the mesa 120*m*. Furthermore, the current spreading layer 230 may cover the current blocking layer 220. The current spreading layer 230 may be electrically connected to the second conductive type semiconductor layer 125 and may form ohmic contact with the second conductive type semiconductor layer 125. The current spreading layer 230 may cover an substantially overall upper surface of the mesa 120*m*, and may be formed along an outer periphery of the upper surface of the mesa 120*m*, as shown in the drawings. When applied through such a current spreading layer 230, electric current can be uniformly spread on the mesa 120*m* in the horizontal direction, thereby improving current spreading of the light emitting diode. The current spreading layer 230 may be formed of a conductive material, such as metals and conductive oxides, for example, a conductive oxide such as ITO, ZnO, IZO, GZO and AZO, a light transmissive metal such as Ni/Au, and a metal such as Ni, Pt, Pd, Rh, W, Ti, Al, Mg, Ag, Cr, and Au.

In some exemplary embodiments, the current spreading layer 230 may have a multilayer structure, and may include a lower current spreading layer 231 disposed on the mesa 120*m* and an upper current spreading layer 233 disposed on the lower current spreading layer 231.

The lower current spreading layer 231 may form ohmic contact with the second conductive type semiconductor layer 125. Further, the lower current spreading layer 231 may be formed of a conductive oxide doped with a predetermined dopant, thereby reducing contact resistance at an interface between the lower current spreading layer 231 and the second conductive type semiconductor layer 125. For example, the lower current spreading layer 231 may include ITO or ZnO doped with at least one dopant selected from among silver (Ag), indium (In), tin (Sn), zinc (Zn), cadmium (Cd), gallium (Ga), aluminum (Al), magnesium (Mg), titanium (Ti), molybdenum (Mo), nickel (Ni), copper (Cu), gold (Au), platinum (Pt), rhodium (Rh), iridium (Ir), ruthenium (Ru), and palladium (Pd).

The lower current spreading layer 231 may have a thickness of about 10 Å to 1,000 Å. The lower current spreading layer 231 may be doped at a doping concentration of about 0.01 at % to about 40 at %, preferably about 0.01 at % to about 20 at %.

The upper current spreading layer 233 may be disposed on the lower current spreading layer 231. The upper current spreading layer 233 may have higher transmittance and lower sheet resistance than the lower current spreading layer 233. For example, when the lower current spreading layer 231 is formed of ITO doped with the dopant, the upper current spreading layer 233 may have a greater thickness than the lower current spreading layer 231 and may be formed of undoped ITO. The undoped ITO has high light transmittance and a higher thickness than the doped ITO, thereby providing lower lateral resistance, that is, lower sheet resistance.

The current spreading layer 230 may have an overall thickness of, for example, about 10,000 Å or less, specifically about 5,000 Å to 9000 Å, more specifically about 6,000 Å or about 8000 Å, without being limited thereto.

As such, the lower current spreading layer 231 having a relatively low thickness and formed of ITO or ZnO doped with a metal is formed to form electrical contact with the second conductive type semiconductor layer 125, thereby improving light transmittance of the lower current spreading layer 231 and ohmic characteristics. Further, the upper current spreading layer 233 is formed to a relatively thick thickness using undoped ITO, thereby improving lateral current spreading efficiency. That is, according to this exemplary embodiment, with the structure wherein the current spreading layer 230 has a multilayer structure including the lower and upper current spreading layers 231, 233, the light emitting diode can reduce forward voltage Vf through improvement in ohmic characteristics and current spreading efficiency, and can improve luminous efficacy through improvement in light transmittance.

In some exemplary embodiments, the current spreading layer 230 may be composed of a single layer. Here, the current spreading layer 230 composed of a single layer may include a transparent conductive oxide having improved ohmic characteristics and light transmittance. For example, the current spreading layer 230 may be composed of a single ZnO layer having higher light transmittance than ITO.

The insulation layer 260 may cover upper surfaces of the light emitting structure 120 and the current spreading layer 230 and include openings exposing the first and second electrodes 240, 250. Further, the insulation layer 260 may include a lower insulation layer 261 and an upper insulation layer 263. In the following description, the lower insulation layer 261 and the upper insulation layer 263 will be separately described, but are not limited thereto.

First, the lower insulation layer 261 may cover a side surface and an upper surface of the light emitting structure 120 and the current spreading layer 230, and may include openings exposing portions of the first conductive type semiconductor layer 121 and the current spreading layer 230. The portions of the first conductive type semiconductor layer 121 and the current spreading layer 230 exposed through the openings of the lower insulation layer 261 may be disposed corresponding to the first and second electrodes 240, 250. In this exemplary embodiment, a portion of the first conductive type semiconductor layer 121 exposed through the contact hole 127 and at least part of the additional contact region 129 may be exposed through the openings. Here, the side surface of the contact hole 127 may be at least partially covered by the lower insulation layer 261. In addition, the main contact holes 127*a* of the contact hole 127 are exposed through the openings, and some secondary contact holes 127*b* of the contact hole 127 are exposed and the other secondary contact holes 127*b* of the contact hole 127 may be covered by the lower insulation layer 261. Further, the portions of the current spreading layer 230 exposed through the openings are disposed on the current blocking layer 220. However, it should be understood that other implementations are also possible.

The lower insulation layer 261 may include an insulation material, for example, $SiO_2$, $SiN_x$, $MgF_2$, and the like. In some exemplary embodiments, the lower insulation layer 261 can also act as a basal layer for other layers formed on the lower insulation layer 261. For example, in the structure wherein the upper insulation layer 263 includes a distributed Bragg reflector, the lower insulation layer 261 can act as a basal layer so as to allow the distributed Bragg reflector to be stably formed thereon. When the distributed Bragg reflector has a stack structure of $TiO_2/SiO_2$ layers alternately stacked one above another, the lower insulation layer 261 may be formed of an $SiO_2$ layer having a predetermined thickness. For example, the predetermined thickness may range from about 0.2 μm to 1.0 μm.

In order to form a distributed Bragg reflector having good quality, it is desirable that the basal layer on which the distributed Bragg reflector will be deposited have good film quality and good surface characteristics. Accordingly, with the lower insulation layer 261 formed to a predetermined thickness or more, the distributed Bragg reflector can be stably formed on the lower insulation layer 261.

The first electrode 240 is electrically connected to the first conductive type semiconductor layer 121. The first electrode 240 is disposed on the exposed portion of the first conductive type semiconductor layer 121 to form ohmic contact with the first conductive type semiconductor layer 121. Particularly, the first electrode 240 may form ohmic contact with the first conductive type semiconductor layer 121 through the contact holes 127 and also form ohmic contact with the first conductive type semiconductor layer 121 through the additional contact region 129. In addition, the first electrode 240 is electrically connected to the first pad 161. In this exemplary embodiment, the first electrode 240 may include first ohmic contact electrodes 241, second ohmic contact electrodes 243, and the third ohmic contact electrode 245.

The first ohmic contact electrodes 241 may be disposed in some main contact holes 127*a*. In addition, the first ohmic contact electrodes 241 may be disposed so as to overlap a region, in which the first pad 161 is formed, in the vertical direction. That is, the first ohmic contact electrodes 241 are disposed under the first pad 161 in the region in which the first pad 161 is formed. Accordingly, the first ohmic contact electrodes 241 may contact the first pad 161. On the other hand, although the plural first ohmic contact electrodes 241 are disposed in some of the main contact holes 127*a* and are spaced apart from each other in this exemplary embodiment, it should be understood that other implementations are also possible. The first ohmic contact electrodes 241 may also be disposed in some of the secondary contact holes 127*b* under the first pad 161, and the first ohmic contact electrodes 241 disposed in the main contact holes 127*a* and spaced apart from each other may also be connected to each other.

The second ohmic contact electrodes 243 may be disposed in the main contact holes 127*a* and the secondary contact holes 127*b*. In addition, the second ohmic contact electrodes 243 may extend in the extension direction of the contact hole 127, that is, from the first side surface 101 towards the third side surface 103. Particularly, the second ohmic contact electrodes 243 may include a main electrode 243*a* disposed below the first pad 161 and an extension electrode 243*b* disposed under a region between the first pad 161 and the second pad 163. Accordingly, the main electrode 243*a* may contact the first pad 161 and the extension electrode 243*b* may extend towards the second pad 163. Accordingly, electrons injected through the main electrode 243*a* contacting the first pad 161 can be easily spread to the extension electrode 243*b*. With this structure, the light emitting diode can relieve current crowding in the first conductive type semiconductor layer 121 disposed below the main electrode 243*a*, thereby improving current spreading efficiency.

Further, the extension electrode 243*b* may include a relatively wide section disposed in the main contact holes 127*a* and a relatively narrow section disposed in the secondary contact holes 127*b*. Electric current can be efficiently supplied to the first conductive type semiconductor layer 121 through the relatively narrow section of the extension electrode 243*b* disposed in the main contact holes 127*a*. Accordingly, the light emitting diode allows efficient supply of electric current to the first conductive type semiconductor layer 121 disposed below the region between the first pad 161 and the second pad 163, thereby improving current spreading efficiency.

The second electrode 250 is disposed on the current spreading layer 230 to be electrically connected to the current spreading layer 230. Particularly, the second electrode 250 may be disposed above the current blocking layer 220. In addition, the second electrode 250 is electrically connected to the second pad 163 and the current spreading layer 230 may be electrically connected to the second pad 163 through the second electrode 250. The second electrode 250 may include at least one first connection electrode 251 and at least one second connection electrode 253.

The first connection electrode 251 may contact the current spreading layer 230 through the openings of the lower insulation layer 261. In addition, the first connection electrode 251 may be disposed to overlap a region, in which the second pad 163 is formed, in the vertical direction. That is, the first connection electrode 251 is disposed under the second pad 163 in the region in which the second pad 163 is formed. With this structure, the first connection electrode 251 may contact the second pad 163. In a structure wherein the second electrode 250 includes a plurality of first connection electrodes 251, the plural first connection electrode 251 may be spaced apart from each other. However, it should be understood that other implementations are also possible and the plurality of the first connection electrode 251 may be connected to each other.

At least part of the second connection electrode 253 may be disposed to overlap a region, in which the second pad 163 is formed, in the vertical direction. The second connection electrode 253 may include a main electrode 253*a* disposed under the second pad 163 to contact the second pad 163 and an extension electrode 253*b* extending from the main electrode 253*a*. The extension electrode 253*b* may extend from the second pad 163 in a direction approaching the first pad 163. In this exemplary embodiment, the extension electrode 253b may extend from the third side surface 103 towards the first side surface 101. Further, the extension electrode 253b may extend to a portion under a region between the first pad 161 and the second pad 163 and may reach a region under the first pad 161. A portion of the extension electrode 253b extending to the region under the first pad 161 is electrically insulated from the first pad 161 by the upper insulation layer 263. As such, with the structure wherein the second connection electrode 253 includes the extension electrode 253b extending to the region under the first pad 161, the light emitting diode can achieve efficient current spreading under the region between the first pad and the second pad 161, 163 and to a portion of the second conductive type semiconductor layer 125 below the first pad 161 while preventing current crowding in the second conductive type semiconductor layer 125 disposed below the main electrode 253a.

The extension electrode 253b may have a narrower width than the main electrode 253a. Accordingly, electric current can be efficiently supplied from the second pad 163 to the second connection electrode 253 through the main electrode 253a and then can be efficiently spread through the extension electrode 253b. Further, in the structure wherein the second electrode 250 includes a plurality of second connection electrode 253, at least part of the first electrode 240 may be disposed between the extension electrodes 253b. As shown in the drawings, the first and second ohmic contact electrodes 241, 243 may be disposed between two extension electrodes 253b and the third ohmic contact electrode 245 may also be disposed between the two extension electrodes 253b. With this structure, the light emitting diode can achieve more efficient current crowding.

In addition, at least part of the first electrode 240 and the second electrode 250 may further cover an upper surface of the lower insulation layer 261. That is, at least part of the first and second electrodes 240, 250 fill the openings of the lower insulation layer 261 and further cover the upper surface of the lower insulation layer 261 around the openings thereof.

The upper insulation layer 263 covers the lower insulation layer 261 and partially covers the first electrode 240 and the second electrode 250. The upper insulation layer 263 includes openings at least partially exposing the first electrode 240 and the second electrode 250.

First, at least part of the first ohmic contact electrode 241 and the third ohmic contact electrode 245 of the first electrode 240 is exposed through the opening of the upper insulation layer 263 and may electrically contact the first pad 161 through the openings thereof. A portion of the second ohmic contact electrode 243 of the first electrode 240 may be exposed through the openings of the upper insulation layer 263 and the remaining portion thereof may be covered by the upper insulation layer 263. Specifically, at least part of the main electrode 243a of the second ohmic contact electrode 243 disposed in the main contact hole 127a is exposed through the opening of the upper insulation layer 263 and the extension electrode 243b of the second ohmic contact electrode 243 is covered by the upper insulation layer 263.

At least part of the first connection electrode 251 of the second electrode 250 is exposed through the openings of the upper insulation layer 263 and electrically connected to the second pad 163 through the openings thereof. A portion of the second connection electrode 253 of the second electrode 250 may be exposed through the openings of the upper insulation layer 263 and the remaining portion thereof may be covered by the upper insulation layer 263. Specifically, at least part of the main electrode 253a of the second connection electrode 253 is exposed through the opening of the upper insulation layer 263 and the extension electrode 253b thereof is covered by the upper insulation layer 263. Accordingly, the extension electrode 253b disposed below the first pad 161 is insulated from the first pad 161 by the upper insulation layer 263.

As such, portions of the first and second electrodes 240, 250 under the region between the first and second pads 161, 163 are covered by the upper insulation layer 263, thereby preventing electric short in the region between the first and second pads 161, 163 due to solder or impurities.

The upper insulation layer 263 may include an insulation material, for example, $SiO_2$, $SiN_x$, $MgF_2$, and the like. In some exemplary embodiments, the upper insulation layer 263 may include a distributed Bragg reflector. The distributed Bragg reflector may be formed by alternately stacking dielectric layers having different refractive indices and may have, for example, a stack structure of $TiO_2/SiO_2$ layers alternately stacked one above the other. Each layer of the distributed Bragg reflector may have an optical thickness corresponding to ¼ of a particular wavelength, and the distributed Bragg reflector may be composed of 4 to 20 pairs of such layers. However, it should be understood that other implementations are also possible. In the structure wherein the upper insulation layer 263 is composed of multiple layers, the uppermost layer of the upper insulation layer 263 may be formed of $SiN_x$. The $SiN_x$ layer exhibits good moisture resistance, thereby protecting the light emitting diode from moisture.

In the structure wherein the upper insulation layer 263 includes the distributed Bragg reflector, the lower insulation layer 261 can act as a basal layer or an interface layer for improving quality of the distributed Bragg reflector. For example, the lower insulation layer 261 may be formed of $SiO_2$ to a thickness of about 0.2 µm to 1.0 µm and the upper insulation layer 263 may be composed of a distributed Bragg reflector in which certain pairs of $TiO_2/SiO_2$ layers are repeated. Here, a layer of the upper insulation layer 263 contacting the lower insulation layer 261 may be a $TiO_2$ layer.

The distributed Bragg reflector may have relatively high reflectance with respect to visible light. The distributed Bragg reflector may be designed to have a reflectance of 90% or more with respect to light entering at an incidence angle of 0~60° and having a wavelength of 400 nm to 700 nm. The distributed Bragg reflector having such reflectance may be provided by adjusting the kind, thickness and stacking cycles of a plurality of dielectric layers constituting the distributed Bragg reflector. Accordingly, it is possible to form a distributed Bragg reflector having high reflectance with respect to light having relatively long wavelengths (for example, 550 nm to 700 nm) and light having relatively short wavelengths (for example, 400 nm to 550 nm).

As such, the distributed Bragg reflector may include a multilayer stack structure in order to have high reflectance with respect to light in a broad wavelength band. That is, the distributed Bragg reflector may include a first stack structure in which dielectric layers having a first thickness are stacked one above another and a second stack structure in which dielectric layers having a second thickness are stacked one above another. For example, the distributed Bragg reflector may include a first stack structure wherein dielectric layers having a smaller thickness than an optical thickness of ¼ of a center wavelength (about 550 nm) of visible light are stacked one above another, and a second stack structure in which dielectric layers having a greater thickness than the optical thickness of ¼ of the center wavelength (about 550 nm) of visible light are stacked one above another. Furthermore, the distributed Bragg reflector may further include a third stack structure in which dielectric layers having a greater thickness than the optical thickness of ¼ of the center wavelength (about 550 nm) of visible light and dielectric layers having a smaller thickness than the optical thickness of ¼ of the center wavelength (about 550 nm) of visible light are alternately stacked one above another.

As light is reflected from the distributed Bragg reflector of the upper insulation layer 263 covering substantially the entirety of the upper surface of the light emitting structure 120, the light emitting diode can have improved luminous efficacy. In addition, as described above, since the current spreading layer 230 may be composed of multiple layers to exhibit relatively high light transmittance, light loss due to absorption of light by the distributed Bragg reflector and the current spreading layer 230 can be reduced, thereby improving luminous efficacy of the light emitting diode.

Further, the upper insulation layer 263 may partially cover the upper surfaces of the first and second electrodes 240, 250. As shown in FIG. 14 to FIG. 16, at least part of the first electrode 240 and the second electrode 250 may further cover the upper surface of the lower insulation layer 271, and the upper insulation layer 263 may further cover at least part of the first electrode 240 and the second electrode 250. Accordingly, at least part of the first electrode 240 and the second electrode 250 may be interposed between the lower insulation layer 261 and the upper insulation layer 263. Accordingly, the first electrode 240 and the second electrode 250 can be stably secured to prevent increase in forward voltage and variation of luminous patterns due to delamination of the electrodes 240, 250, thereby improving electrical and optical reliability of the light emitting diode.

Although the insulation layer 260 is illustrated as including the lower insulation layer 261 and the upper insulation layer 263 in this exemplary embodiment, it should be understood that other implementations are also possible. In some exemplary embodiments, as shown in FIG. 16, the insulation layer 260 may be composed of a single layer or may be a single layer of a multilayer structure instead of being separately formed. In these exemplary embodiments, the electrodes 240, 250 may not have a portion interposed between the insulation layers 260.

Referring again to FIG. 12 to FIG. 15, the first pad 161 and the second pad 163 are disposed on the upper insulation layer 263. The first pad 161 and the second pad 163 are electrically connected to the first electrode 240 and the second electrode 250, respectively. Particularly, the first pad 161 may contact parts of the first ohmic contact electrodes 241 and the second ohmic contact electrodes 243 while contacting the third ohmic contact electrode 245, and the second pad 163 may contact a portion of the second connection electrode 253 while contacting the first connection electrode 161.

In another exemplary embodiment, the light emitting diode may further include a heat dissipation pad (not shown). The heat dissipation pad according to this exemplary embodiment is generally similar to that of the above exemplary embodiments, and thus a detailed description thereof will be omitted herein.

FIGS. 18A to FIG. 25B are plan views and cross-sectional views illustrating a method of manufacturing a light emitting diode according to yet another exemplary embodiment of the present disclosure.

In each of FIGS. 18A to FIGS. 25B is a plan view and a cross-sectional view taken along line D-D' of the plan view. Detailed descriptions of the same components as those of the exemplary embodiment described in FIG. 12 to FIG. 15 will be omitted.

Figure 18A:
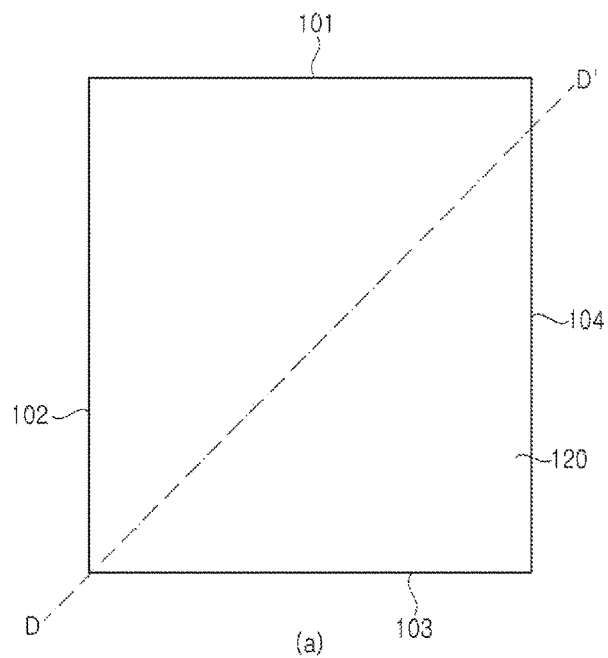
FIG. 18A to FIG. 25B are plan views and cross-sectional views illustrating a method of manufacturing a light emitting diode according to yet another exemplary embodiment of the present disclosure.
Figure 18B:
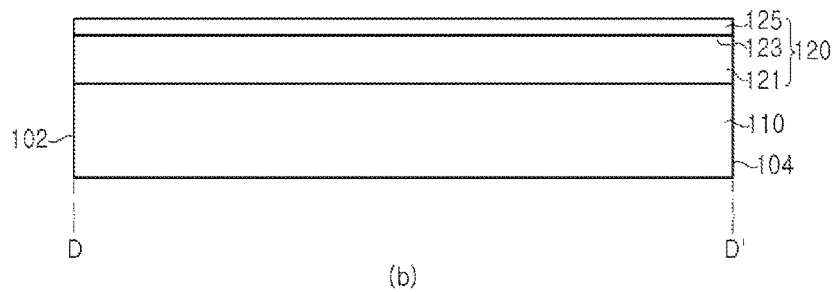

Referring to FIGS. 18A and 18B, a light emitting structure 120 including a first conductive type semiconductor layer 121, an active layer 123 and a second conductive type semiconductor layer 125 is formed on a growth substrate 110.

The growth substrate 110 may be any substrate that allows growth of the light emitting structure 120 thereon. For example, the growth substrate 110 may include a sapphire substrate, a silicon carbide substrate, a silicon substrate, a gallium nitride substrate, and an aluminum nitride substrate. The light emitting structure 120 may be formed by a typical method of growing nitride semiconductors, such as metal-organic chemical vapor deposition (MOCVD), hydride vapor phase epitaxy (HVPE), and molecular beam epitaxy (MBE), all of which are well known to those skilled in the art.

Although FIGS. 18A and 18B show the growth substrate 110 and the light emitting structure 120 corresponding to a single device, this exemplary embodiment can also be substantially applied to a light emitting diode fabricated using a wafer including the light emitting structure 120 grown on the growth substrate 110.

Figure 19A:
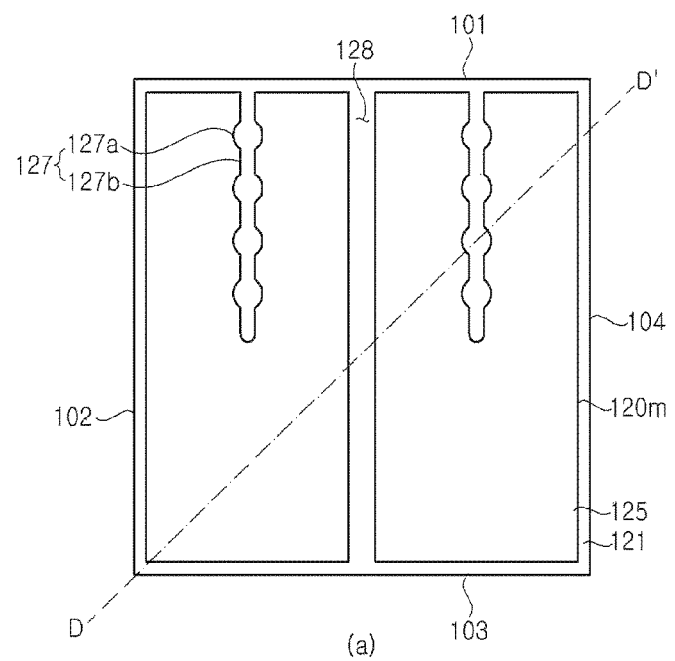
Figure 19B:
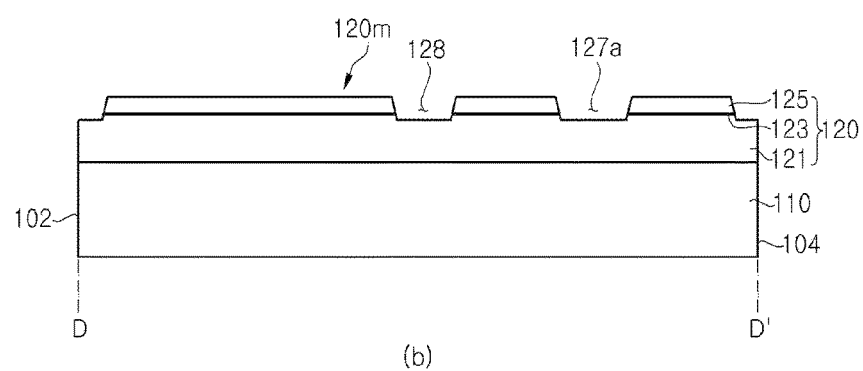

Referring to FIGS. 19A and 19B, a plurality of mesas 120m is formed by partially removing the light emitting structure 120.

The mesas 120m may be formed by patterning, for example, by partially removing the second conductive type semiconductor layer 125 and the active layer 123 through photolithography and etching. The process of forming the mesas 120m may include forming a contact hole 127 in each of the mesas 120m and a separation region 128 between the mesas 120m. The contact hole 127 may include main contact holes 127a and secondary contact holes 127b, as described above.

Figure 20A:
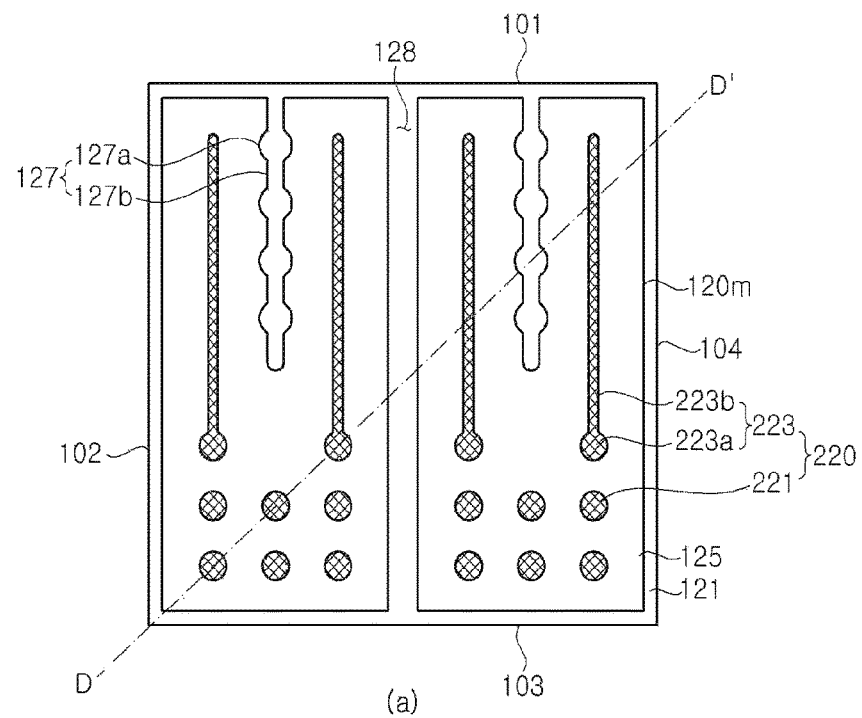
Figure 20B:
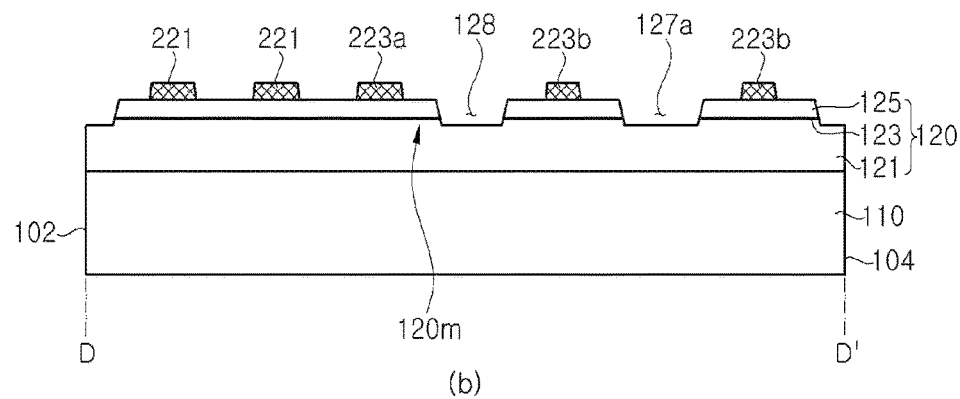

Next, referring to FIGS. 20A and 20B, a current blocking layer 220 is formed on the mesas 120m. The current blocking layer 220 may be formed corresponding to a region in which second electrodes 250 will be formed. Formation of the current blocking layer 220 may include forming a first connection electrode current blocking layer 221 disposed at a location corresponding to the first connection electrode 251 and a second connection electrode current blocking layer 223 disposed at a location corresponding to the second connection electrode 253. Further, the second connection electrode current blocking layer 223 may include a main electrode current blocking layer 223a and an extension electrode current blocking layer 223b.

The current blocking layer 220 may include an insulation material and may be formed on the mesas 120m by a method known in the art. For example, the current blocking layer 220 is formed on an overall upper surface of the light emitting structure 120 through sputtering, e-beam evaporation or plating and curing, followed by patterning through wet etching or dry etching, as shown in FIGS. 20A and 20B. Alternatively, the current blocking layer 220 may also be formed by forming a photoresist mask, depositing a material for the current blocking layer 220, and removing the photoresist through a lift-off process.

Figure 21A:
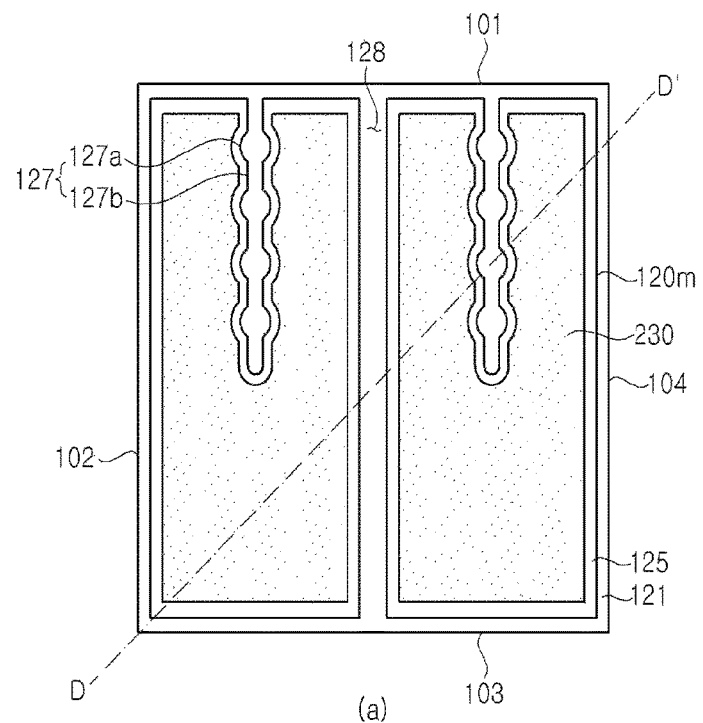
Figure 21B:
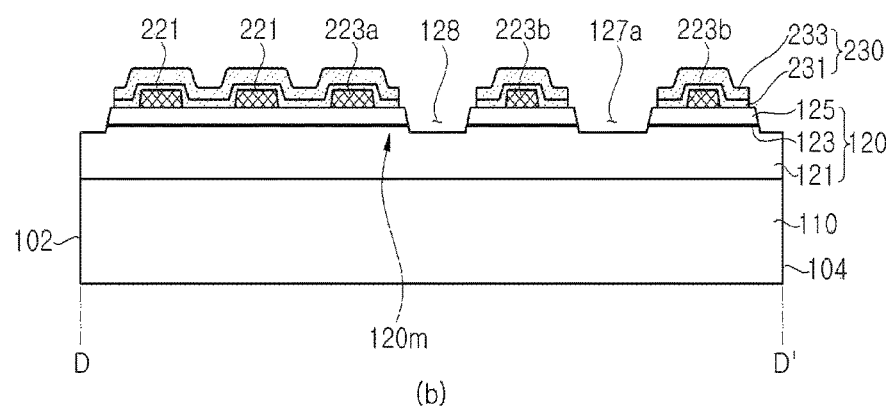

Referring to FIGS. 21A and 21B, a current spreading layer 230 is formed to cover the current blocking layer 220 on the mesas 120m.

The current spreading layer 230 may include a conductive oxide, for example, ITO. Further, the current spreading layer 230 may include a lower current spreading layer 231 and an upper current spreading layer 233. The lower and upper current spreading layers 231, 233 may be sequentially formed through separate processes or may be formed through different processes. For example, the lower current spreading layer 231 may be formed of ITO doped with a dopant including a metal and the upper current spreading layer 233 may be formed of undoped ITO. Here, the lower and upper current spreading layers 231, 233 may be formed by e-beam evaporation or sputtering, or by different methods. The current spreading layer 230 including the conductive oxide may be subjected to patterning through etching.

It should be understood that other implementations are also possible, and if the current spreading layer 230 is formed of a metal, the current spreading layer 230 may be formed by plating, deposition or the like, and may be subjected to patterning through a lift-off process.

Although the current spreading layer 230 is illustrated as being formed after formation of the mesas 120m and the current blocking layer 220 in this exemplary embodiment, it should be understood that other implementations are also possible. Alternatively, after the current blocking layer 220 and the current spreading layer 230 are sequentially formed, the mesas 120m may be formed by etching the current spreading layer 230 and the light emitting structure 120 in the same process.

Figure 22A:
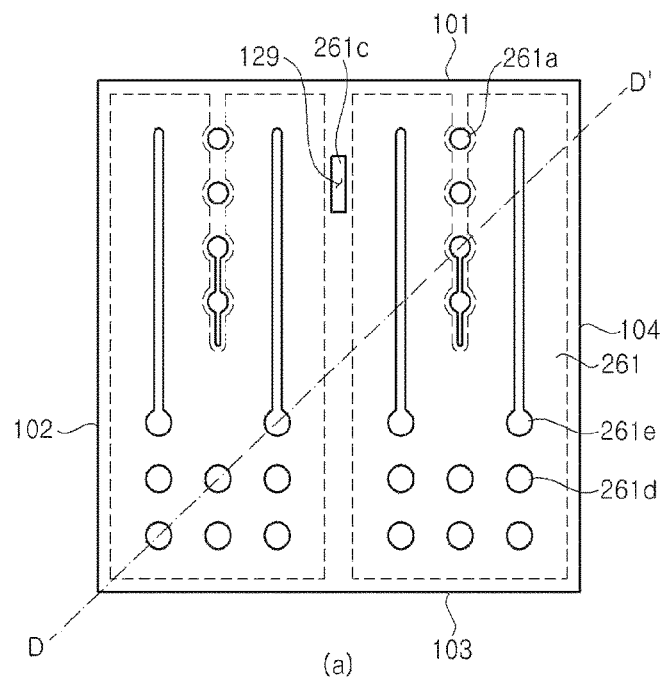
Figure 22B:
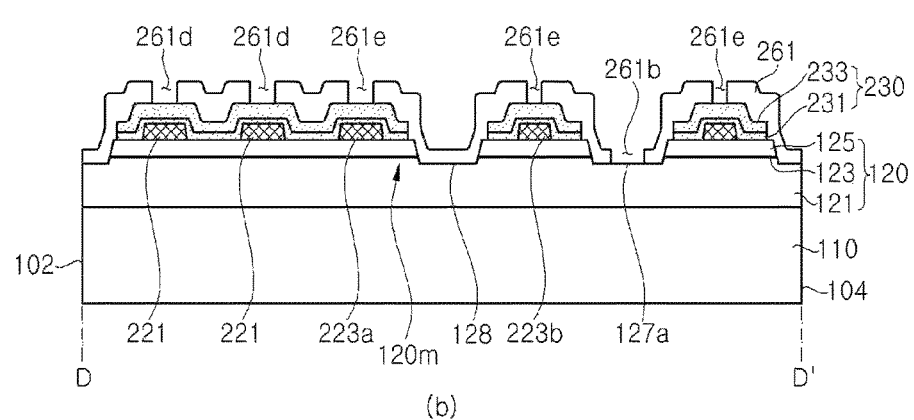
Figure 23A:
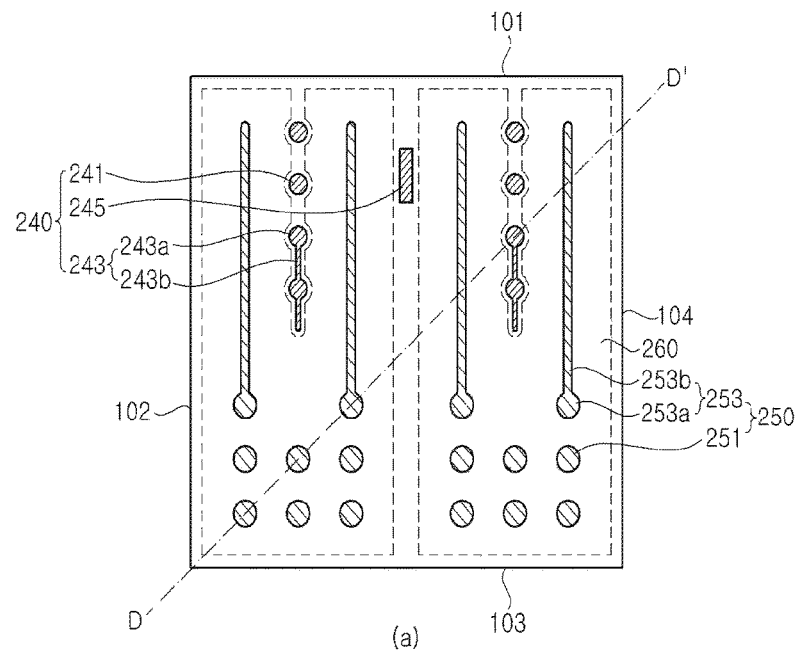
Figure 23B:
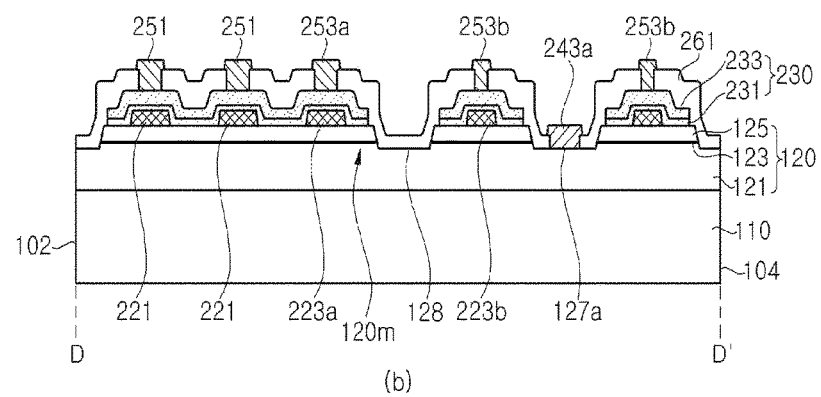

Next, referring to FIGS. 22A and 22B, a lower insulation layer 261 is formed to partially cover the light emitting structure 120 and the current spreading layer 230. Formation of the lower insulation layer 261 may include depositing an insulation material such as $SiO_2$ on upper surfaces of the light emitting structure 120 and the current spreading layer 230, and forming first to fifth openings 261a, 261b, 261c, 261d, 261e through patterning.

The first openings 261a may expose at least part of the main contact holes 127a, the second openings 261b may expose at least part of the main contact holes 127a and the secondary contact holes 127b, and the third opening 261c may expose at least part of an additional contact region 129. The fourth openings 261d and the fifth openings 261e may partially expose the current spreading layer 230 and may be disposed at locations corresponding to a first connection electrode 251 and a second connection electrode 253.

Referring again to FIGS. 23A and 23B, first and second electrodes 240, 250 are formed such that the first to fifth openings 261a, 261b, 261c, 261d, 261e of the lower insulation layer 261 can be at least partially filled therewith. The first and second electrodes 240, 250 may be formed by the same process through deposition and lift-off. When the first and second electrodes 240, 250 are formed in a multilayer structure through the same process, the first and second electrodes 240, 250 may have the same multilayer structure. However, it should be understood that other implementations are also possible. Alternatively, the first and second electrodes 240, 250 may be formed of different materials in different layers through separate processes.

First to third ohmic contact electrodes 241, 243, 245 of the first electrode 240 may be formed to fill the first to third openings 261a, 261b, 261c, respectively, while covering an upper surface of the lower insulation layer 261 around the first to third openings 261a, 261b, 261c. First and second connection electrodes 251, 253 of the second electrode may be formed to fill the fourth and fifth openings 261d, 261e, respectively while covering the upper surface of the lower insulation layer 261 around the fourth and fifth openings 261d, 261e.

Figure 24A:
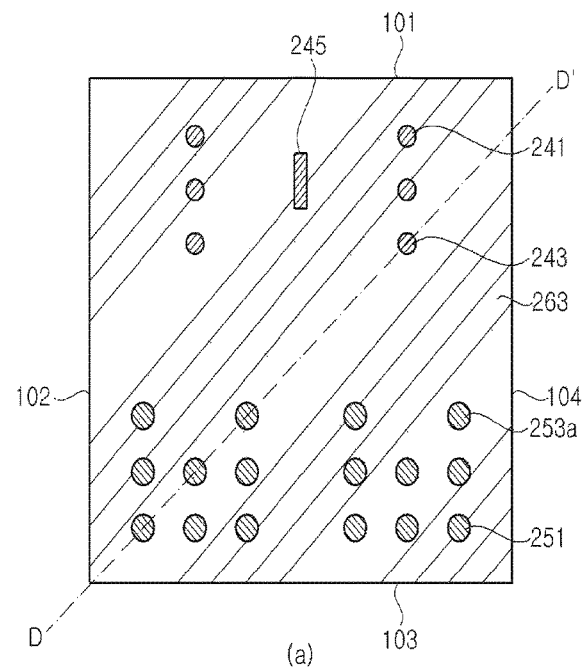
Figure 24B:
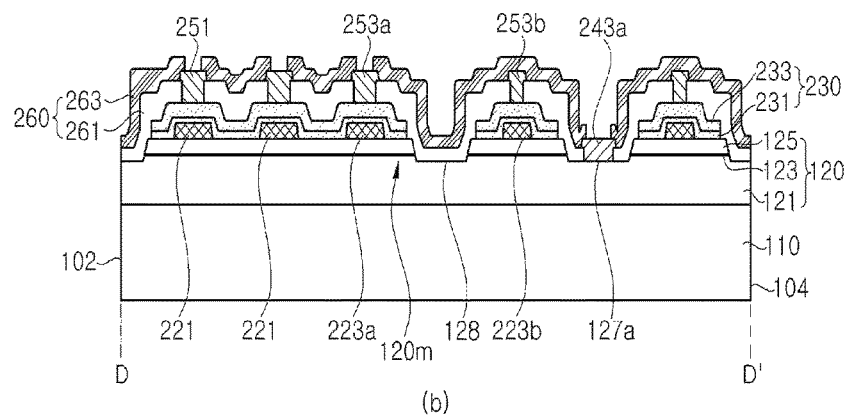

Next, referring to FIGS. 24A and 24B, an upper insulation layer 263 is formed on the lower insulation layer 261 so as to partially cover the first and second electrodes 240, 250. The upper insulation layer 263 may be composed of a distributed Bragg reflector in which material layers having different refractive indices are stacked one above another, and the lower insulation layer 261 can act as a basal layer or an interfacial layer for the distributed Bragg reflector. The upper insulation layer 263 may be formed by deposition and etching processes known in the art. The upper insulation layer 263 may include a plurality of openings through which the first electrode 240 and second electrode 250 are exposed.

Figure 25A:
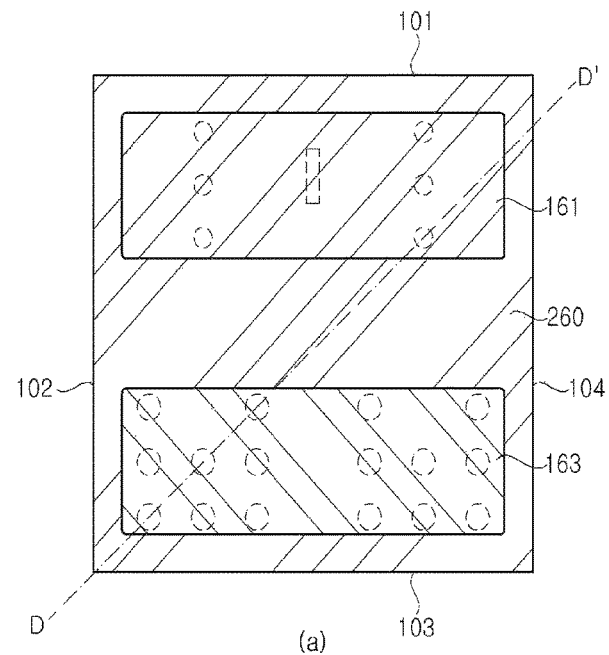
Figure 25B:
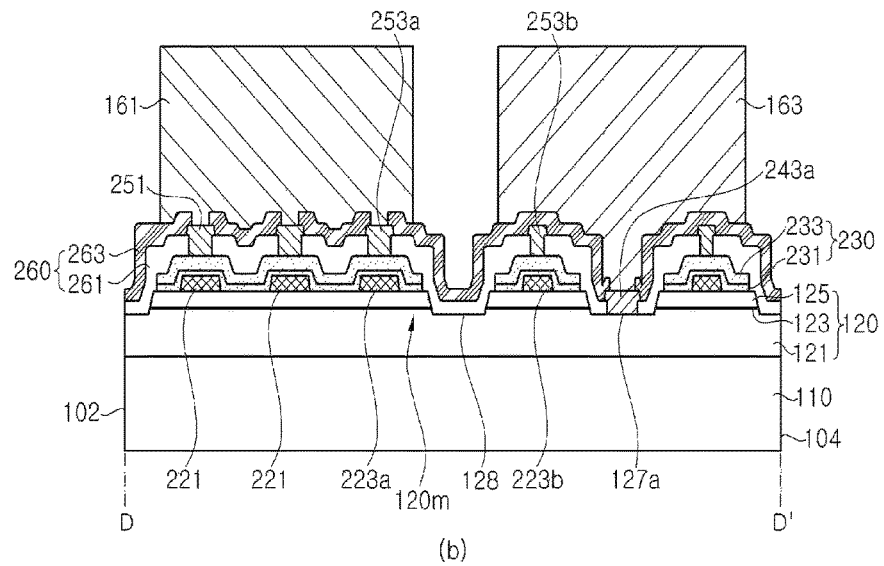

Next, referring to FIGS. 25A and 25B, a first pad 161 and a second pad 163 may be formed on the upper insulation layer 263. As a result, the light emitting diode as shown in FIG. 12 to FIG. 15 can be provided.

The first pad 161 may contact the first electrode 240 through the openings of the upper insulation layer 263. Likewise, the second pad 163 may contact the second electrode 250 through the openings of the upper insulation layer 263. The first and second pads 161, 163 may be formed at the same time by the same process, for example, by photolithography and etching or lift-off.

In addition, the method may further include separating the substrate 110 from the light emitting structure 120. The substrate 110 can be separated or removed therefrom by physical and/or chemical processes.

Figure 26:
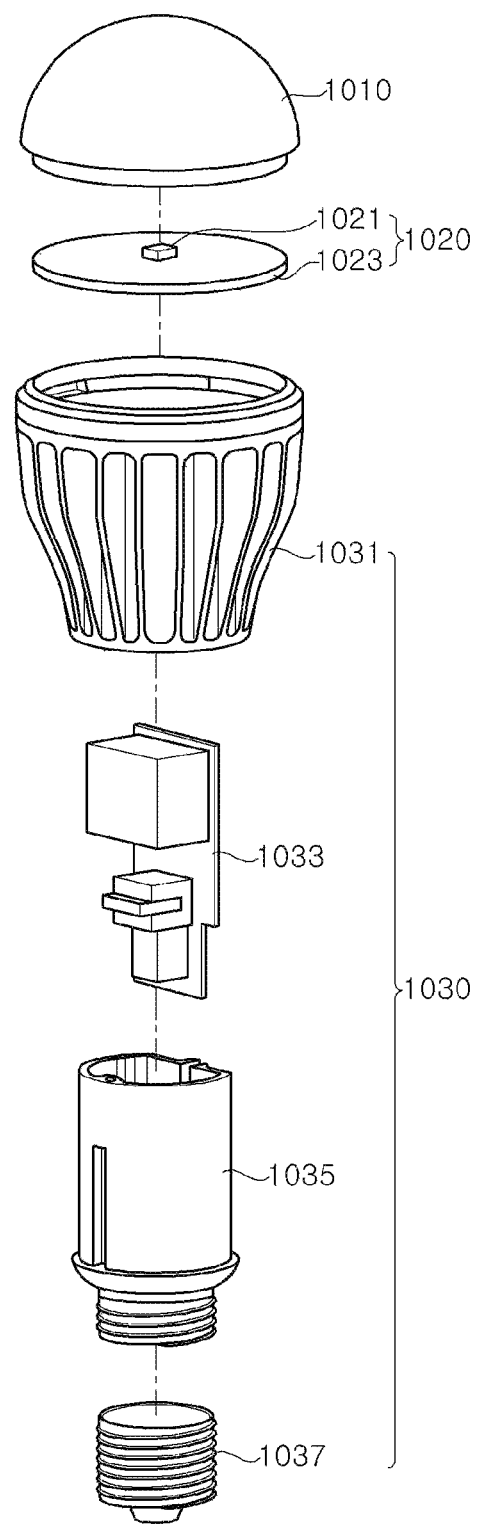
FIG. 26 is an exploded perspective view of a lighting apparatus to which a light emitting diode according to one exemplary embodiment of the present disclosure is applied.

FIG. 26 is an exploded perspective view of a lighting apparatus to which a light emitting diode according to one exemplary embodiment of the present disclosure is applied.

Referring to FIG. 26, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 27:
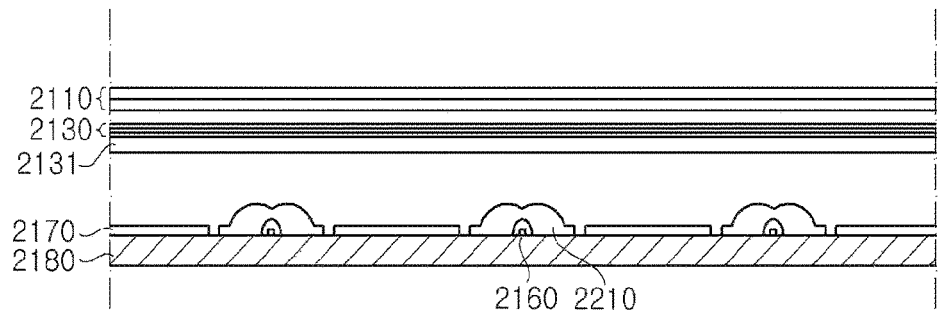
FIG. 27 is a cross-sectional view of one example of the display apparatus to which the light emitting diode according to the exemplary embodiment of the present disclosure is applied.

FIG. 27 is a cross-sectional view of one example of a display apparatus to which a light emitting diode according to one exemplary embodiment of the present disclosure is applied.

The display according to this embodiment includes a display panel 2110, a backlight unit supplying light to the display panel 2110, and a panel guide 2100 supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate 2150, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one other, without being limited thereto. However, it should be understood that the light source module may include a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diode 2160. Light emitted from the light emitting diode 2160 may be supplied in the form of sheet light to the display panel 2110 through the diffusive plate 2131 and the optical sheets 2130.

In this way, the light emitting diodes according to the exemplary embodiments may be applied to direct type displays like the display according to this embodiment.

Figure 28:
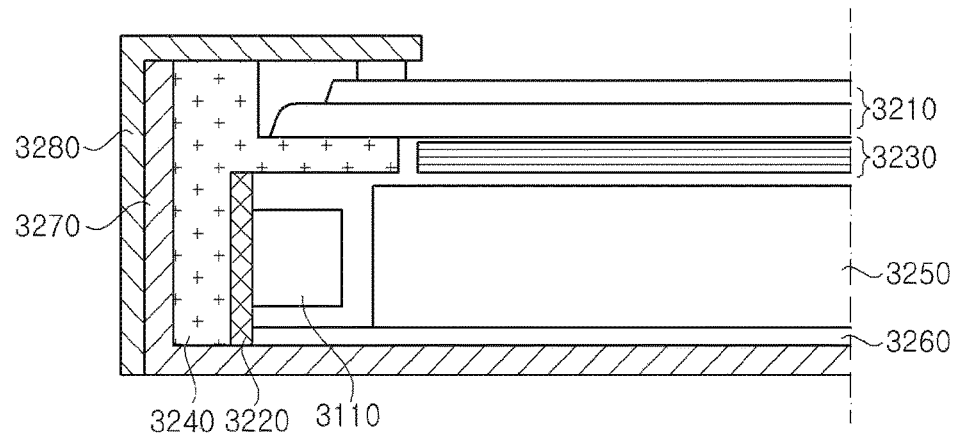
FIG. 28 is a cross-sectional view of another example of the display apparatus to which the light emitting diode according to the exemplary embodiment of the present disclosure is applied.

FIG. 28 is a cross-sectional view of another example of the display apparatus to which the light emitting diode according to the exemplary embodiment of the present disclosure is applied.

The display according to this exemplary embodiment includes a display panel 3210 on which an image is displayed, and a backlight unit disposed at a rear side of the display panel 3210 and emitting light thereto. Further, the display includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display according to this exemplary embodiment.

Figure 29:
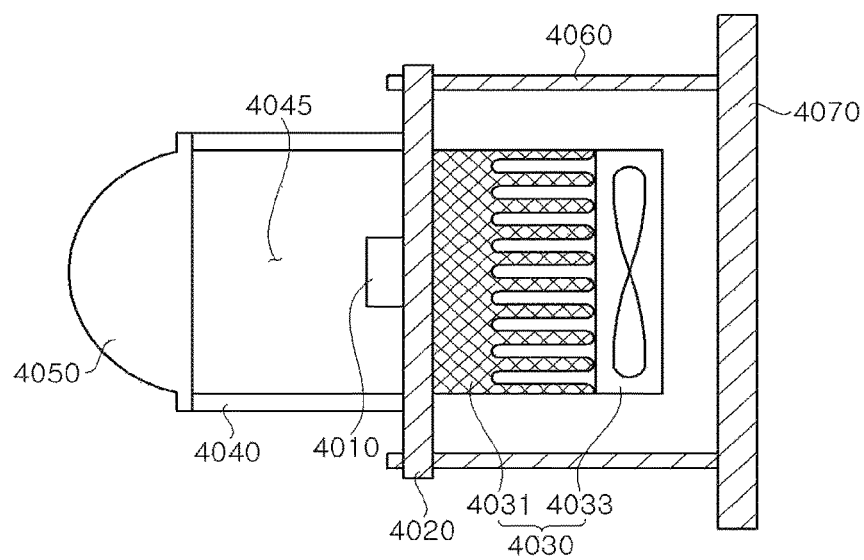
FIG. 29 is a cross-sectional view of a headlight to which a light emitting diode according to one exemplary embodiment of the present disclosure is applied.

FIG. 29 is a cross-sectional view of a headlight to which a light emitting diode according to one exemplary embodiment of the present disclosure is applied.

Referring to FIG. 29, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiment may be applied to headlights, particularly, headlights for vehicles, like the headlight according to this embodiment.

Although some exemplary embodiments have been described herein, it should be understood by those skilled in the art that these embodiments are given by way of illustration only, and that various modifications, variations and alterations can be made without departing from the spirit and scope of the present disclosure.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A light emitting diode comprising:
    a first conductive type semiconductor layer;
    a first light emitting unit disposed on the first conductive type semiconductor layer and comprising an active layer, a second conductive type semiconductor layer, and at least one contact hole formed through the second conductive type semiconductor layer and the active layer so as to expose a portion of the first conductive type semiconductor layer;
    an additional contact region disposed outside the first light emitting unit and partially exposing the first conductive type semiconductor layer;
    first electrodes forming ohmic contact with the first conductive type semiconductor layer through the contact hole of the first light emitting unit and the additional contact region;
    a second electrode disposed on the first light emitting unit and forming ohmic contact with the second conductive type semiconductor layer; and
    a lower insulation layer covering a side surface of the first conductive type semiconductor layer, the first light emitting unit, and the second electrodes,
    wherein the lower insulation layer is shaped to include a first opening exposing the contact hole and the additional contact region and a second opening partially exposing the second electrode, the first and second electrode being insulated from each other, and
    a first pad and a second pad that are disposed on the first light emitting unit.

2. The light emitting diode according to claim 1, further comprising at least three additional light emitting units and the additional contact region is disposed in a region surrounded by the first light emitting unit and the at least three additional light emitting units.

3. The light emitting diode according to claim 2, wherein the additional contact region is disposed in a region in which corners of each of the first light emitting unit and the at least three additional light emitting units meet.

4. The light emitting diode according to claim 2, wherein distances from a center of the additional contact region to centers of the first light emitting unit and the at least three additional light emitting units are the same.

5. The light emitting diode according to claim 1, wherein the contact hole is disposed in a central region of the first light emitting unit.

6. The light emitting diode according to claim 1, further comprising:
    one or more connection layers electrically connecting the second electrode disposed on the first light emitting units to the second electrode disposed on another light emitting unit adjacent to the first light emitting unit.

7. The light emitting diode according to claim 1, wherein the first electrodes cover at least part of the lower insulation layer and contact the first conductive type semiconductor layer through the first opening.

8. The light emitting diode according to claim 7, wherein the first electrodes further cover the first conductive type semiconductor layer and side surfaces of the first light emitting unit and are insulated by the lower insulation layer.

9. The light emitting diode according to claim 1, wherein the first pad is electrically connected to one of plurality of the first electrodes, and the second pad is electrically connected to the second electrode.

10. The light emitting diode according to claim 9, wherein the first electrodes comprise inner first electrodes under the first pad and an outer first electrode exposed by the first pad.

11. The light emitting diode according to claim 10, wherein the inner first electrodes are separated by the insulation layer.

12. The light emitting diode according to claim 10, wherein one of inner first electrodes is connected to the outer first electrode.

13. The light emitting diode according to claim 1, wherein the contact hole is partly surrounded by the second electrode.

14. The light emitting diode according to claim 13, further comprising a second connection electrode on the second electrode, the second connection comprising a main electrode disposed under the second pad and an extension electrode extending from the main electrode towards the first pad.

15. The light emitting diode according to claim 1, further comprising a second light emitting diode disposed on the first conductive type semiconductor layer, comprising an active layer, a second conductive type semiconductor layer, and at least one contact hole formed through the second conductive type semiconductor layer and the active layer to expose a portion of the first conductive type semiconductor layer.

* * * * *